(12) United States Patent
Naito

(10) Patent No.: US 10,559,682 B2
(45) Date of Patent: Feb. 11, 2020

(54) SEMICONDUCTOR APPARATUS AND SEMICONDUCTOR APPARATUS MANUFACTURING METHOD

(71) Applicant: FUJI ELECTRIC CO., LTD., Kanagawa (JP)

(72) Inventor: Tatsuya Naito, Matsumoto (JP)

(73) Assignee: FUJI ELECTRIC CO., LTD., Kanagawa (JP)

( * ) Notice: Subject to any disclaimer, the term of this patent is extended or adjusted under 35 U.S.C. 154(b) by 0 days.

(21) Appl. No.: 16/001,937

(22) Filed: Jun. 7, 2018

(65) Prior Publication Data

US 2018/0366578 A1 Dec. 20, 2018

(30) Foreign Application Priority Data

Jun. 15, 2017 (JP) .................. 2017-118171

(51) Int. Cl.
| | | |
|---|---|---|
| *H01L 29/00* | (2006.01) | |
| *H01L 29/78* | (2006.01) | |
| *H01L 29/66* | (2006.01) | |
| *H01L 29/861* | (2006.01) | |
| *H01L 29/08* | (2006.01) | |
| *H01L 29/10* | (2006.01) | |
| *H01L 29/417* | (2006.01) | |

(52) U.S. Cl.
CPC ...... *H01L 29/7819* (2013.01); *H01L 29/0804* (2013.01); *H01L 29/1004* (2013.01); *H01L 29/41708* (2013.01); *H01L 29/66704* (2013.01); *H01L 29/8613* (2013.01)

(58) Field of Classification Search
None
See application file for complete search history.

(56) References Cited

U.S. PATENT DOCUMENTS

| | | | |
|---|---|---|---|
| 8,653,628 B1 * | 2/2014 | Song ................. | H01L 29/36 257/341 |
| 2004/0084724 A1 * | 5/2004 | Kapels ............. | H01L 21/28512 257/330 |
| 2009/0020852 A1 | 1/2009 | Harada | |

(Continued)

FOREIGN PATENT DOCUMENTS

| | | |
|---|---|---|
| JP | 2005057028 A | 3/2005 |
| JP | 2009026797 A | 2/2009 |
| WO | 2016133027 A1 | 8/2016 |

*Primary Examiner* — Ali Naraghi

(57) ABSTRACT

To provide a semiconductor apparatus including: a semiconductor substrate having a drift region; an emitter region provided inside the semiconductor substrate and above the drift region; a base region provided between the emitter and drift regions; an accumulation region provided between the base and drift regions; and a plurality of gate trench portions provided to penetrate the accumulation region from an upper surface of the semiconductor substrate. The base region has: a low concentration base region provided in contact with the gate trench portions; and a high concentration base region provided apart from the gate trench portions and having a doping concentration higher than the low concentration base region. The high concentration base region is provided below the emitter region, and a width of the high concentration base region in a depth direction of the semiconductor substrate is larger than 0.1 μm.

19 Claims, 27 Drawing Sheets

(56) References Cited

U.S. PATENT DOCUMENTS

2016/0240641 A1* 8/2016 Okawara ............. H01L 29/7397
2016/0247808 A1* 8/2016 Horiuchi ................ H01L 29/78
2017/0141217 A1   5/2017 Shirakawa et al.

* cited by examiner

SEMICONDUCTOR APPARATUS AND SEMICONDUCTOR APPARATUS MANUFACTURING METHOD

The contents of the following Japanese patent application(s) are incorporated herein by reference:
NO. 2017-118171 filed in JP on Jun. 15, 2017.

BACKGROUND

1. Technical Field

The present invention relates to a semiconductor apparatus and a manufacturing method therefor.

2. Related Art

Conventionally, semiconductor apparatuses such as insulated-gate bipolar transistors (IGBTs) have been known (please see Patent Documents 1 and 2, for example).
Patent Document 1: WO2016/133027
Patent Document 2: Japanese Patent Application Publication No. 2005-57028
It is desirable to improve characteristics such as saturation current characteristics in semiconductor apparatuses.

SUMMARY

A first aspect of the present invention provides a semiconductor apparatus including a semiconductor substrate having a first conductivity-type drift region. The semiconductor apparatus may include a first conductivity-type emitter region that is provided inside the semiconductor substrate and above the drift region and has a doping concentration higher than that of the drift region. The semiconductor apparatus may include a second conductivity-type base region provided inside the semiconductor substrate and between the emitter region and the drift region. The semiconductor apparatus may include a first conductivity-type accumulation region that is provided inside the semiconductor substrate and between the base region and the drift region and has a doping concentration higher than that of the drift region. The semiconductor apparatus may include a plurality of gate trench portions that: are provided to penetrate the emitter region, the base region and the accumulation region from an upper surface of the semiconductor substrate; are arranged to extend in a predetermined direction of extension at the upper surface of the semiconductor substrate; and are provided with conductive portions therein. The base region may have: a low concentration base region provided in contact with the gate trench portion; and a high concentration base region that: is provided in contact with the low concentration base region; is provided apart from the gate trench portion; and has a doping concentration higher than that of the low concentration base region. The high concentration base region may be provided below the emitter region. A width of the high concentration base region in a depth direction of the semiconductor substrate may be larger than 0.1 μm.
The width of the high concentration base region in the depth direction of the semiconductor substrate may be no smaller than ⅕ of a width of the emitter region in the depth direction.
The semiconductor apparatus may include a second conductivity-type contact region that is provided in contact with the emitter region in the direction of extension and has a doping concentration higher than that of the high concentration base region. The contact region may be provided in contact with the high concentration base region.
A part of the low concentration base region may be provided: in contact with the high concentration base region in the predetermined direction of extension at the upper surface of the semiconductor substrate; and below the contact region. A width of the emitter region in the direction of extension may be larger than a width of the contact region in the direction of extension.
The high concentration base region may protrude in the depth direction of the semiconductor substrate more than the low concentration base region does. The emitter region may be provided in contact with the high concentration base region. The high concentration base region may be provided in contact with the accumulation region.
A width, in the direction of extension, of the high concentration base region in contact with the accumulation region may be larger than a width, in the direction of extension, of the low concentration base region in contact with the accumulation region. In the depth direction of the semiconductor substrate, the low concentration base region may be provided between the accumulation region and the high concentration base region.
The accumulation region may have a first opening. The drift region may be in contact with the high concentration base region below the emitter region through the first opening. The first opening may be provided apart from the gate trench portion, and the drift region may be in contact with the high concentration base region below the emitter region through the first opening.
The accumulation region may have a second opening. The drift region may be in contact with the low concentration base region below the contact region through the second opening.
The semiconductor apparatus may further include a dummy trench portion that is provided to spread from the upper surface of the semiconductor substrate into the semiconductor substrate, and is arranged to extend in the predetermined direction of extension at the upper surface of the semiconductor substrate. The accumulation region, the high concentration base region and the emitter region may be provided in contact with the dummy trench portion.
The semiconductor apparatus may further include: a dummy trench portion that is provided to spread from the upper surface of the semiconductor substrate into the semiconductor substrate and is arranged to extend in the predetermined direction of extension at the upper surface of the semiconductor substrate; and a second conductivity-type intermediate region that is provided between the drift region and the high concentration base region in the depth direction of the semiconductor substrate and has a doping concentration lower than that of the high concentration base region. The intermediate region, the high concentration base region and the emitter region may be provided in contact with the dummy trench portion.
The semiconductor apparatus may include a plurality of the accumulation regions in the depth direction of the semiconductor substrate. The plurality of accumulation regions may be in contact with the gate trench portion. The plurality of accumulation regions may be provided below the emitter region.
A second aspect of the present invention provides a semiconductor apparatus manufacturing method. In the semiconductor apparatus according to the first aspect of the present invention, doping a first conductivity-type dopant into the contact region; and after the doping the first conductivity-type dopant, doping a second conductivity-type dopant into the high concentration base region may be performed.

The summary clause does not necessarily describe all necessary features of the embodiments of the present invention. The present invention may also be a sub-combination of the features described above.

DESCRIPTION OF EXEMPLARY EMBODIMENTS

Hereinafter, (some) embodiment(s) of the present invention will be described. The embodiment(s) do(es) not limit the invention according to the claims, and all the combinations of the features described in the embodiment(s) are not necessarily essential to means provided by aspects of the invention.

In the present specification, one of the directions parallel with the depth direction of a semiconductor substrate is referred to as the "upward" direction and the other direction is referred to as the "downward" direction. Among the two principal surfaces of a substrate, a layer or another member, one of the surfaces is referred to as the upper surface and the other surface is referred to as the lower surface. The "upward" and "downward" directions are not limited to the direction of gravity or the direction of attachment to a substrate or the like at the time of implementation of a semiconductor apparatus.

In the present specification, technical matters are explained in some cases using orthogonal coordinate axes which are an X-axis, a Y-axis and a Z-axis. In the present specification, a plane parallel with the upper surface of a semiconductor substrate is treated as an XY-plane, and the depth direction of the semiconductor substrate is treated as the Z-axis.

Although in each example shown, the first conductivity-type is N-type, and the second conductivity-type is P-type, the first conductivity-type may alternatively be P-type, and the second conductivity-type may alternatively be N-type. In this case, conductivity types of substrates, layers, regions and the like in each example become opposite polarities, respectively.

Figure 1:
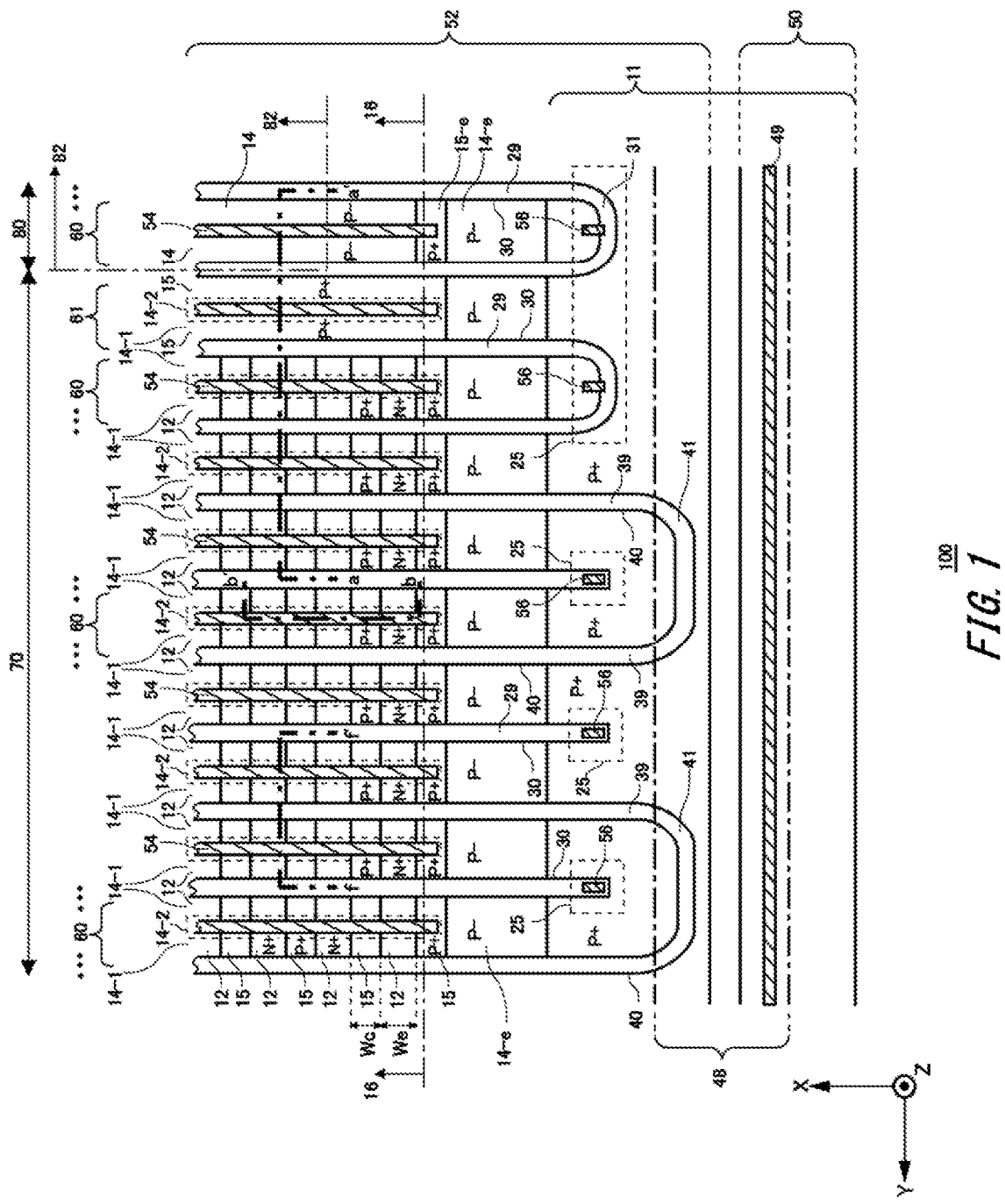
FIG. 1 is a figure showing a part of the upper surface of a semiconductor apparatus 100 according to an embodiment of the present invention.

FIG. 1 is a figure showing a part of the upper surface of a semiconductor apparatus 100 according to an embodiment of the present invention. The semiconductor apparatus 100 in the present example is a semiconductor chip including a transistor portion 70 and a diode portion 80. The transistor portion 70 includes a transistor such as an IGBT. The diode portion 80 is provided side-by-side with the transistor portion 70 at the upper surface of a semiconductor substrate and includes a diode such as a FWD (Free Wheel Diode). In FIG. 1, the chip upper surface around a chip end portion is shown, and other regions are omitted.

In addition, although in FIG. 1, an active region of the semiconductor substrate in the semiconductor apparatus 100 is shown, the semiconductor apparatus 100 may have an edge termination structure portion surrounding the active region. The active region refers to a region where current flows if the semiconductor apparatus 100 is controlled to enter the ON-state. The edge termination structure portion relaxes electric field concentration on the upper surface side of the semiconductor substrate. The edge termination structure portion has, for example, a guard ring, a field plate, a RESURF or a structure obtained by combining them.

The semiconductor apparatus 100 in the present example includes gate trench portions 40, dummy trench portions 30, a well region 11, emitter regions 12, base regions 14 and contact regions 15 that are provided inside the semiconductor substrate and are exposed to the upper surface of the semiconductor substrate. In addition, the semiconductor apparatus 100 in the present example includes an emitter electrode 52 and a gate metal layer 50 that are provided above the upper surface of the semiconductor substrate. The emitter electrode 52 and the gate metal layer 50 are provided apart from each other and are electrically insulated from each other.

Although an interlayer dielectric film is provided between the emitter electrode 52 and gate metal layer 50 and the upper surface of the semiconductor substrate, it is omitted in FIG. 1. In the interlayer dielectric film in the present example, contact holes 56, a contact hole 49 and contact holes 54 are provided to penetrate the interlayer dielectric film.

In addition, the emitter electrode 52 passes through the contact holes 56 and are connected with dummy conductive portions in the dummy trench portions 30. Connecting portions 25 formed of a conductive material such as polysilicon doped with impurities may be provided between the emitter electrode 52 and the dummy conductive portions. An insulating film such as an oxide film is provided between the connecting portion 25 and the upper surface of the semiconductor substrate.

The gate metal layer 50 passes through the contact hole 49 and contacts a gate runner 48. The gate runner 48 is formed of polysilicon doped with impurities or the like. At the upper surface of the semiconductor substrate, the gate runner 48 is connected with gate conductive portions in the gate trench portions 40. The gate runner 48 is not connected with the dummy conductive portions in the dummy trench portions 30. The gate runner 48 in the present example is provided to spread from below the contact hole 49 and reach edge portions of the gate trench portion 40. An insulating film such as an oxide film is provided between the gate runner 48 and the upper surface of the semiconductor substrate. At the edge portions of the gate trench portions 40, the gate conductive portions are exposed to the upper surface of the semiconductor substrate and in contact with the gate runner 48.

The emitter electrode 52 and the gate metal layer 50 are formed of metal-containing materials. For example, at least a partial region of each electrode is formed of aluminum or an aluminum-silicon alloy. Each electrode may have a barrier metal formed of titanium, a titanium compound or the like at a layer underlying the region formed of aluminum or the like or may have a plug formed of tungsten or the like in a contact hole.

One or more gate trench portions 40 and one or more dummy trench portions 30 are arrayed at predetermined intervals along a predetermined array direction (the Y-axis direction in the present example) in the region in the transistor portion 70. In the transistor portion 70, one or more gate trench portions 40 and one or more dummy trench portions 30 may be provided alternately along the array direction.

A gate trench portion 40 in the present example may have: two extending portions 39 extending along a direction of extension (the X-axis direction in the present example) parallel with the upper surface of the semiconductor substrate and perpendicular to the array direction; and a connecting portion 41 connecting the two extending portions 39. At least a part of the connecting portion 41 is preferably provided in a curved line form. By connecting end portions of the two extending portions 39 of the gate trench portion 40, electric field concentration at the end portions of the extending portions 39 can be relaxed. The gate runner 48 may connect with a gate conductive portion at the connecting portion 41 of the gate trench portion 40.

Dummy trench portions 30 in the present example are provided between respective extending portions 39 of the gate trench portions 40. Similar to the gate trench portions 40, the dummy trench portions 30 may have U-shapes at the upper surface of a semiconductor substrate. That is, a dummy trench portion 30 in the present example may have two extending portions 29 extending along the direction of extension and a connecting portion 31 connecting the two extending portions 29. A dummy trench portion 30 in the present example may not have a connecting portion 31, but alternatively have a straight line shape extending in the direction of extension.

In the diode portion 80, a plurality of dummy trench portions 30 may be arrayed continuously. In addition, also in a region in the transistor portion 70 which is adjacent to the diode portion 80, a plurality of dummy trench portions 30 may be arrayed continuously. The region in the transistor portion 70 which is adjacent to the diode portion 80 refers to a region in the transistor portion 70 which is arranged closest to the diode portion 80 side. The region may be or may not be in contact with the diode portion 80. In the present example, extending portions 29 in straight line shapes of respective trench portions are connected by a connecting portion 31 to form one trench portion.

The emitter electrode 52 is provided above the gate trench portions 40, dummy trench portions 30, well region 11, emitter regions 12, base regions 14 and contact regions 15. The well region 11 is of the second conductivity-type, and is provided in a predetermined range from an end portion of an active region on a side provided with the gate metal layer 50. The diffusion depth of the well region 11 may be larger than the depths of the gate trench portions 40 and dummy trench portions 30. Regions that constitute parts of the gate trench portions 40 and dummy trench portions 30 and are on the gate metal layer 50 side are provided in the well region 11. The bottoms of the ends of the dummy trench portions 30 in the direction of extension may be covered by the well region 11.

The semiconductor apparatus in the present example has mesa portions 60 and a boundary mesa portion 61 in the transistor portion 70. The boundary mesa portion 61 is a mesa portion in a region which is in the transistor portion 70 and is adjacent to the diode portion 80. In the mesa portions 60 and boundary mesa portion 61 sandwiched by respective trench portions, base regions 14 are provided. The base regions 14 are of the second conductivity-type with a doping concentration lower than that of the well region 11. The base regions 14 in the present example are of P--type. The base regions 14 have low concentration base regions 14-1 provided in contact with the gate trench portions 40 and high concentration base regions 14-2 having a doping concentration higher than that of the low concentration base regions 14-1. The high concentration base regions 14-2 are provided in regions indicated with broken line portions in FIG. 1. A mesa portion 60 may be a portion of the semiconductor substrate which: is sandwiched by two adjacent trench portions; and ranges from the upper surface of the semiconductor substrate to a depth of the deepest bottom portion of the respective trench portions. In the present example, at both end portions of the respective mesa portions 60 and boundary mesa portions 61 in the X-axis direction, base regions 14-e are arranged (in FIG. 1, end portions on only one side in the X-axis direction are shown).

At the upper surfaces of the mesa portions 60 in the transistor portion 70, first conductivity-type emitter regions 12 having a doping concentration higher than that of the semiconductor substrate are selectively provided. The emitter regions 12 in the present example are of N+-type. The emitter regions 12 are provided in contact with the gate trench portions 40 at the upper surfaces of the mesa portions 60. The emitter regions 12 may be provided in contact with or may be provided apart from the dummy trench portions 30 at the upper surfaces of the mesa portions 60. The emitter regions 12 in the example of FIG. 1 are in contact with the dummy trench portions 30.

As shown in FIG. 1, the semiconductor apparatus 100 in the present example may include, in the transistor portion 70, first conductivity-type contact regions 15 that: are provided in contact with emitter regions 12 in the direction of extension of the gate trench portions 40 (the X-axis direction in the present example); and have a doping concentration higher than that of the high concentration base regions 14-2. The contact regions 15 in the present example are of P+-type.

The width of an emitter region 12 in the direction of extension is defined as a width We. The width of a contact region 15 in the direction of extension is defined as a width Wc. The width We may be larger than the width Wc. The width We may be no smaller than 120% of the width Wc and no larger than 180% of the width Wc. By making the width We larger than the width Wc, the saturation current characteristics of the semiconductor apparatus 100 can be improved. In addition, by making the width We larger than the width Wc, the width, in the X-axis direction, of the high concentration base regions 14-2 that are present on the lower surface side of the emitter regions 12 can be made large. Because of this, the base resistance of the high concentration base regions 14-2 can be lowered. Because of this, latch-ups of the semiconductor apparatus 100 can be suppressed while at the same time improving the saturation current characteristics.

The width of the high concentration base regions 14-2 in the Y-axis direction may be approximately the same as the width of the contact holes 54. Alternatively, the width of the high concentration base regions 14-2 in the Y-axis direction may be larger than or smaller than the width of the contact holes 54.

The contact regions 15 in the transistor portion 70 may be provided in contact with or may be provided apart from the gate trench portions 40 at the upper surfaces of the mesa portions 60. In the example of FIG. 1, the contact regions 15 in the transistor portion 70 are provided in contact with the gate trench portions 40 at the upper surfaces of the mesa portions 60. The contact regions 15 may be provided in contact with or may be provided apart from the dummy trench portions 30 at the upper surfaces of the mesa portions 60. The contact regions 15 in the example of FIG. 1 are in contact with the dummy trench portions 30.

Each among the emitter regions 12 and contact regions 15 has a portion exposed through a contact hole 54. The emitter regions 12 and contact regions 15 in the transistor portion 70 are provided alternately in the X-axis direction at the upper surfaces of the mesa portions 60.

In a mesa portion 60 in the diode portion 80 in the present example, an emitter region 12 is not provided. In the mesa portion 60 in the diode portion 80, a contact region 15 or base region 14 is provided to spread from one of dummy trench portions 30 sandwiching the mesa portion 60 and reach the other dummy trench portion 30. That is, at the upper surface of the semiconductor substrate, the width, in the Y-axis direction, of the mesa portion 60 in the diode portion 80 and the width, in the Y-axis direction, of the contact region 15 or base region 14 provided to the mesa portion 60 in the diode portion 80 are equal to each other.

The diode portion 80 has a first conductivity-type cathode region 82 in a region on the lower surface side of the semiconductor substrate. In FIG. 1, the region, as seen from above, of the semiconductor substrate in which the cathode region 82 is provided is indicated with a broken line portion. The diode portion 80 may be a region that imaginarily appears at the upper surface of the semiconductor substrate if the cathode region 82 is imaginarily projected onto the upper surface.

As one example, the mesa portion 60 in the diode portion 80 is provided with a contact region 15 over the entire region sandwiched by base regions 14-e. Likewise, the boundary mesa portion 61 in the transistor portion 70 may be provided with a contact region 15 over the entire region sandwiched by base regions 14-e. The mesa portion 60 in the diode portion 80 may be provided with a contact region 15 having an area of exposure to the upper surface of the semiconductor substrate that is smaller than that of the contact region 15 of the boundary mesa portion 61 in the transistor portion 70. As one example, the mesa portion 60 in the diode portion 80 is provided with contact regions 15-e at both end portions, in the X-axis direction, of the region sandwiched by base regions 14-e, and the entire region sandwiched by the contact regions 15-e is provided with a base region 14.

In the transistor portion 70, the contact holes 54 are provided above the respective regions of the contact regions 15 and emitter regions 12. In the diode portion 80, the contact hole 54 is provided above the contact region 15 and base region 14. No contact holes 54 are arranged above base regions 14-e arranged at both ends of the mesa portions 60 in the X-axis direction and the well region 11.

The semiconductor apparatus 100 has, inside the semiconductor substrate, a first conductivity-type accumulation region 16 provided between the base regions 14 and a drift region. In FIG. 1, a range over which the accumulation region 16 is provided is indicated with an alternate long and short dash line. In addition, the diode portion 80 has the first conductivity-type cathode region 82 in a region on the lower surface side of the semiconductor substrate. In FIG. 1, a range over which the cathode region 82 is provided is indicated with an alternate long and short dash line. A region that is on the lower surface side of the semiconductor substrate and where the cathode region 82 is not provided may be provided with a second conductivity-type collector region.

Figure 2:
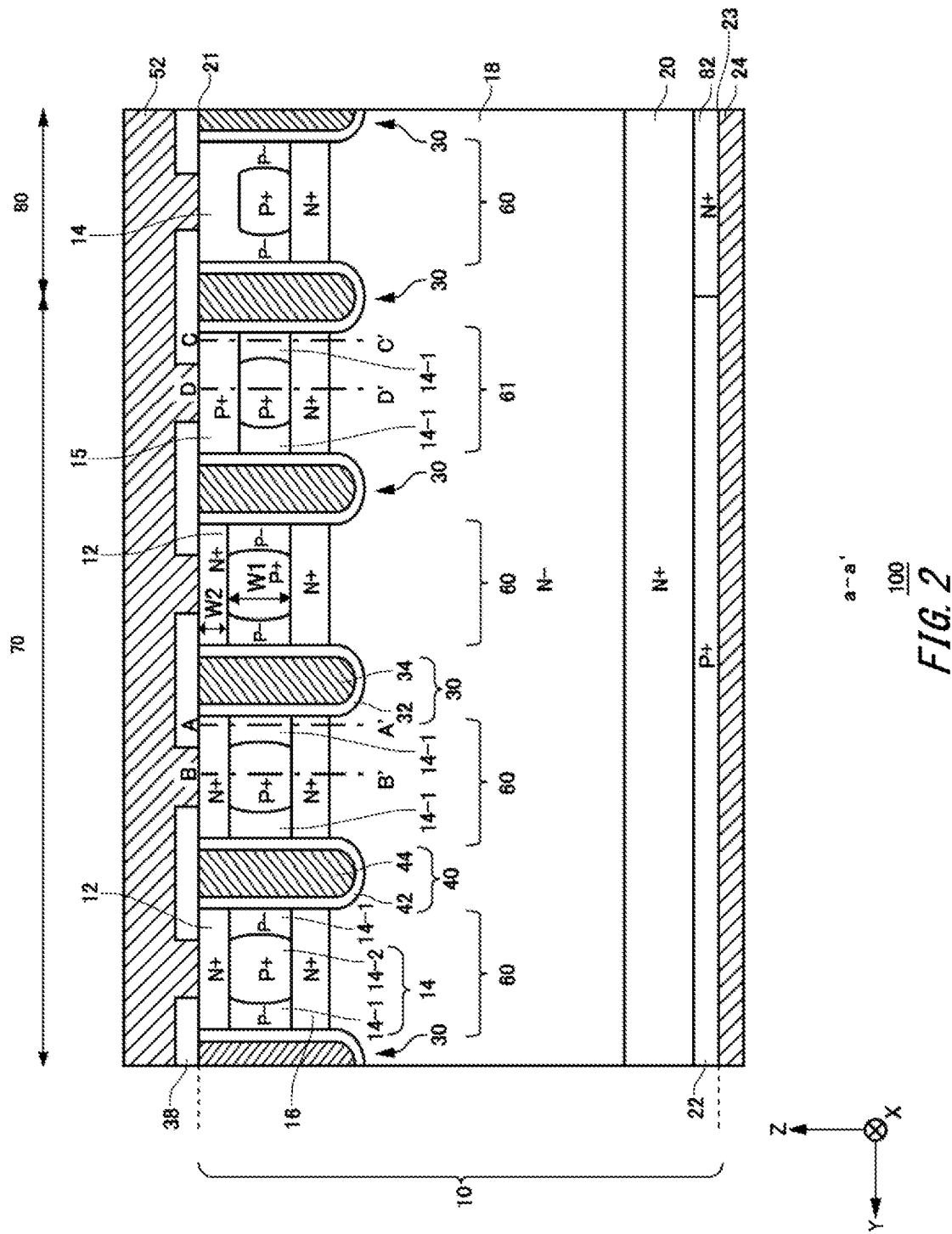
FIG. 2 is a figure showing one example of a cross section taken along a-a' in FIG. 1.

FIG. 2 is a figure showing one example of a cross section taken along a-a' in FIG. 1. The cross section taken along a-a' is a YZ plane passing through emitter regions 12 in the transistor portion 70 and diode portion 80. The semiconductor apparatus 100 in the present example has, in the cross section taken along a-a', a semiconductor substrate 10, interlayer dielectric films 38, the emitter electrode 52 and a collector electrode 24. The emitter electrode 52 is provided at the upper surfaces of the semiconductor substrate 10 and interlayer dielectric films 38.

The collector electrode 24 is provided at a lower surface 23 of the semiconductor substrate 10. The emitter electrode 52 and collector electrode 24 are formed of conductive materials such as metal. In the present specification, the direction linking the emitter electrode 52 and the collector electrode 24 is referred to as the depth direction (Z-axis direction).

The semiconductor substrate 10 may be a silicon substrate, may be a silicon carbide substrate or may alternatively be a nitride semiconductor substrate such as a gallium nitride substrate or the like. The semiconductor substrate 10 in the present example is a silicon substrate. The semiconductor substrate 10 includes a first conductivity-type drift region 18. The drift region 18 in the present example is of N−-type. The drift region 18 may be a region that is left free of other doping regions, with such other doping regions not being formed therein.

The semiconductor substrate 10 is provided with P-type base regions 14 between the emitter regions 12 and the drift region 18. The base regions 14 have P−-type low concentration base regions 14-1 in contact with a gate trench portion 40 and P+-type high concentration base regions 14-2 having a doping concentration higher than that of the low concentration base regions 14-1. The high concentration base regions 14-2 are provided in contact with the low concentration base regions 14-1, the high concentration base regions 14-2 being, on a plane parallel with the upper surface of the semiconductor substrate 10, opposite to the gate trench portion 40 relative to the low concentration base regions 14-1 in a direction perpendicular to the direction of extension of the gate trench portion 40. In the present example, in the Y-axis direction in FIG. 2, the high concentration base regions 14-2 are provided: in contact with the low concentration base regions 14 in contact with the gate trench portions 40; and opposite to the gate trench portion 40. The high concentration base regions 14-2 may be in contact with the low concentration base regions 14-1 in the Y-axis direction in FIG. 2. The high concentration base regions 14-2 may be provided, in the mesa portions 60, to be sandwiched by the low concentration base regions 14-1 in the Y-axis direction. The emitter regions 12 may be in contact with the high concentration base regions 14-2. The high concentration base regions 14-2 may be in contact with accumulation regions 16.

The low concentration base regions 14-1 may be provided to sandwich the high concentration base regions 14-2 in a direction parallel with the upper surface of the semiconductor substrate 10. That is, in the direction parallel with the upper surface of the semiconductor substrate 10, the low concentration base regions 14-1 may have: portions in contact with the high concentration base regions 14-2 on the gate trench portion 40 side; and portions in contact with the high concentration base regions 14-2 on the side opposite to the gate trench portion 40. The low concentration base regions 14-1 on the gate trench portion 40 side may be in contact with the gate trench portion 40. The low concentration base regions 14-1 on the side opposite to the gate trench portion 40 may be in contact with dummy trench portions 30. The doping concentration of high concentration base regions 14-2 may be lower than the doping concentration of a contact region 15.

In the present example, doping may be performed on the contact region 15 earlier than on the high concentration base regions 14-2. That is, after a first step of doping a first conductivity-type dopant to the contact region 15, a second step of doping a second conductivity-type dopant to the high concentration base regions 14-2 may be performed. By performing the doping to the high concentration base regions 14-2 after the doping to the contact region 15, the thermal history of the high concentration base regions 14-2 can be suppressed.

The width of the high concentration base regions 14-2 in the depth direction is defined as a width W1. The width W1 is larger than 0.1 µm. By making the width W1 larger than 0.1 µm, the base resistance of the semiconductor apparatus 100 can be lowered. Because of this, the semiconductor apparatus 100 in the present example can suppress latch-ups while at the same time improving the saturation current characteristics by increasing the width We of the emitter regions 12 in FIG. 1. For a similar reason, the width W1 may be larger than 0.2 µm, and may be larger than 0.3 µm.

The width of the emitter regions 12 in the depth direction is defined as the width W2. The width W1 may be no smaller than ⅕ of the width W2. By making the width W1 no smaller than ⅕ of the width W2, the base resistance of the semiconductor apparatus 100 can be lowered. Because of this, latch-ups of the semiconductor apparatus 100 can be suppressed while at the same time improving the saturation current characteristics. For a similar reason, the width W1 may be no smaller than ¼ of the width W2. In addition, the width W1 may be no smaller than ½ of the width W2. The width W1 may be larger than the width W2.

The second step of doping a second conductivity-type dopant to the high concentration base regions 14-2 may be performed after the process of forming the contact holes 54. By performing the process of doping to the base regions 14 through the contact holes 54, the high concentration base regions 14-2 can be formed in regions surrounding parts of the contact holes 54 as seen from the upper surface side of the semiconductor substrate 10 as shown in FIG. 1.

The second step of doping a second conductivity-type dopant to the high concentration base regions 14-2 may be performed at the same process as the first step of doping a first conductivity-type dopant to the contact region 15. By performing the process of doping to the high concentration base regions 14-2 at the same process as the process of doping to the contact region 15, the manufacturing process of the semiconductor apparatus 100 can be simplified.

The diode portion 80 has the N+-type cathode region 82 below the buffer region 20. The cathode region 82 may be a region provided at the same depth as a collector region 22 in the transistor portion 70. Thereby, in a power inverter circuit such as an inverter, the diode portion 80 may function as a free wheel diode (FWD) that causes reversely flowing reflux current to flow when the transistor portion 70 of another semiconductor apparatus is turned off.

Below the boundary mesa portion 61, a collector region 22 is provided at the lower surface 23. The collector region 22 may be an extension of the collector region 22 in the transistor portion 70. Because the collector region 22 extends to the lower surface 23 of the boundary mesa portion 61, it is possible to ensure that there is a certain distance between the emitter regions 12 in the transistor portion 70 and the cathode region 82 in the diode portion 80. Because of this, it is possible to prevent electrons injected to the drift region 18 from a gate structure portion including emitter regions in the transistor portion 70 from flowing out to the cathode region 82 in the diode portion 80.

In the present example, as compared with a case where the cathode region 82 is provided to reach a region immediately below the boundary mesa portion 61, the distance between the contact region 15 of the boundary mesa portion 61 and the cathode region 82 in the diode portion 80 can also be made long. Thereby, when the diode portion 80 becomes conductive, it is possible to suppress injection of holes into the cathode region 82 from the contact region 15 having a doping concentration higher than that of the base regions 14.

Gate trench portions 40 and dummy trench portions 30 are provided to spread from the upper surface 21 of the semiconductor substrate 10, and penetrate the emitter regions, base regions 14 and accumulation regions into the semiconductor substrate 10 (the drift region 18 in the present example). As mentioned above, mesa portions 60 are regions that are inside the semiconductor substrate 10 and sandwiched by the gate trench portions 40 and the dummy trench portions 30. The respective mesa portions 60 may be provided with base regions 14.

As shown in FIG. 2, in the cross section taken along a-a', mesa portions 60 in the transistor portion 70 are provided with emitter regions 12. The emitter regions 12 are provided inside the mesa portions 60 and above the drift region 18. In regions in contact with the gate trench portion 40, the emitter regions 12 in the present example are provided between the base regions 14 and the upper surface 21 of the semiconductor substrate 10.

The contact region 15 is provided inside a mesa portion 60 and between the upper surface 21 of the semiconductor substrate 10 and the drift region 18. In a region in contact with dummy trench portions 30, the contact region 15 in the present example are provided between a base region 14 and the upper surface 21 of the semiconductor substrate 10. The contact region 15 may be provided to be deeper than the emitter regions 12 in the Z-axis direction of FIG. 2.

A boundary mesa portion 61 may not be provided with an emitter region 12. In addition, the boundary mesa portion 61 may be provided with the contact region 15 in contact with both of two dummy trench portions 30.

As shown in FIG. 2, in the cross section taken along a-a', the mesa portion 60 in the diode portion 80 is provided with a base region 14. In the present example, the mesa portion 60 in the diode portion 80 is provided with none of a contact region 15 and an emitter region 12.

In the present example, in each among the mesa portions 60 and boundary mesa portion 61, an N+-type accumulation region 16 having a doping concentration higher than that of the drift region 18 is provided between a base region 14 and the drift region 18. The accumulation region 16 may be arranged above the lower end of each trench portion. By providing an accumulation region 16, the carrier injection-enhancement effect (IE effect) can be enhanced, and the ON-voltage can be lowered.

In both the transistor portion 70 and the diode portion 80, an N+-type buffer region 20 is provided below the drift region 18. The doping concentration of the buffer region 20 is higher than the doping concentration of the drift region 18. The buffer region 20 may function as a field stop layer to prevent a depletion layer spreading from the lower surface side of base regions 14 from reaching the P+-type collector region 22 and the N+-type cathode region 82.

In the transistor portion 70, the P+-type collector region 22 is provided below the buffer region 20. In the diode portion 80, the N+-type cathode region 82 is provided below the buffer region 20. As one example, the diode portion 80 is a region that overlaps the cathode region 82 in a direction perpendicular to the lower surface 23 of the semiconductor substrate 10. In addition, the transistor portion 70 is a region: that is in a region that overlaps the collector region 22 in a direction perpendicular to the lower surface 23 of the semiconductor substrate 10; and where a predetermined unit configuration including an emitter region 12 and a contact region 15 are orderly arranged.

At the upper surface 21 of the semiconductor substrate 10, one or more gate trench portions 40 and one or more dummy trench portions 30 are provided. Each trench portion is provided to spread from the upper surface 21 of the semiconductor substrate 10, penetrate base regions 14 and reach the drift region 18. In a region provided with at least any of an emitter region 12, a contact region 15 and an accumulation region 16, each trench portion is provided to penetrate also these regions and reach the drift region 18. Trench portions being penetrating doping regions are not limited to trench portions that are manufactured by a process of forming the doping regions and then forming the trench portions in this order. Trench portions that are manufactured by a process of forming the trench portions and then forming doping regions between the trench portions are also assumed to be trench portions penetrating doping regions.

A gate trench portion 40 has a gate trench provided at the upper surface 21 of the semiconductor substrate 10, a gate insulating film 42 and a gate conductive portion 44. The gate insulating film 42 is provided to cover the inner wall of the gate trench. The gate insulating film 42 may be formed by oxidizing or nitriding a semiconductor at the inner wall of the gate trench. The gate conductive portion 44 is provided on the inner side relative to the gate insulating film 42 inside the gate trench. That is, the gate insulating film 42 insulates the gate conductive portion 44 from the semiconductor substrate 10. The gate conductive portion 44 is formed of a conductive material such as polysilicon.

The gate conductive portion 44 includes a region facing a base region 14, with the gate insulating film 42 being sandwiched therebetween. The gate trench portion 40 in the cross section is covered by an interlayer dielectric film 38 at the upper surface of the semiconductor substrate 10. If a predetermined voltage is applied to the gate conductive portion 44, a channel is formed by an electron inversion layer at a surface layer of the interface of the base region 14 in contact with the gate trench.

A dummy trench portion 30 may have the same structure as that of a gate trench portion 40 in the cross section. A dummy trench portion 30 has a dummy trench provided at the upper surface side of the semiconductor substrate 10, a dummy insulating film 32 and a dummy conductive portion 34. The dummy insulating film 32 is formed to cover the inner wall of the dummy trench. The dummy conductive portion 34 is provided inside the dummy trench and is provided on the inner side relative to the dummy insulating film 32. The dummy insulating film 32 insulates the dummy conductive portion 34 from the semiconductor substrate 10. The dummy conductive portion 34 may be formed of the same material as that of the gate conductive portion 44. For example, the dummy conductive portion 34 is formed of a conductive material such as polysilicon. The dummy conductive portion 34 may have a length in the depth direction which is the same as that of the gate conductive portion 44. The dummy trench portion 30 in the cross section is covered by an interlayer dielectric film 38 at the upper surface 21 of the semiconductor substrate 10. Bottom portions of dummy trench portions 30 and gate trench portions 40 may have downwardly convex curved surface forms (curved line forms in the cross section).

Figure 3:
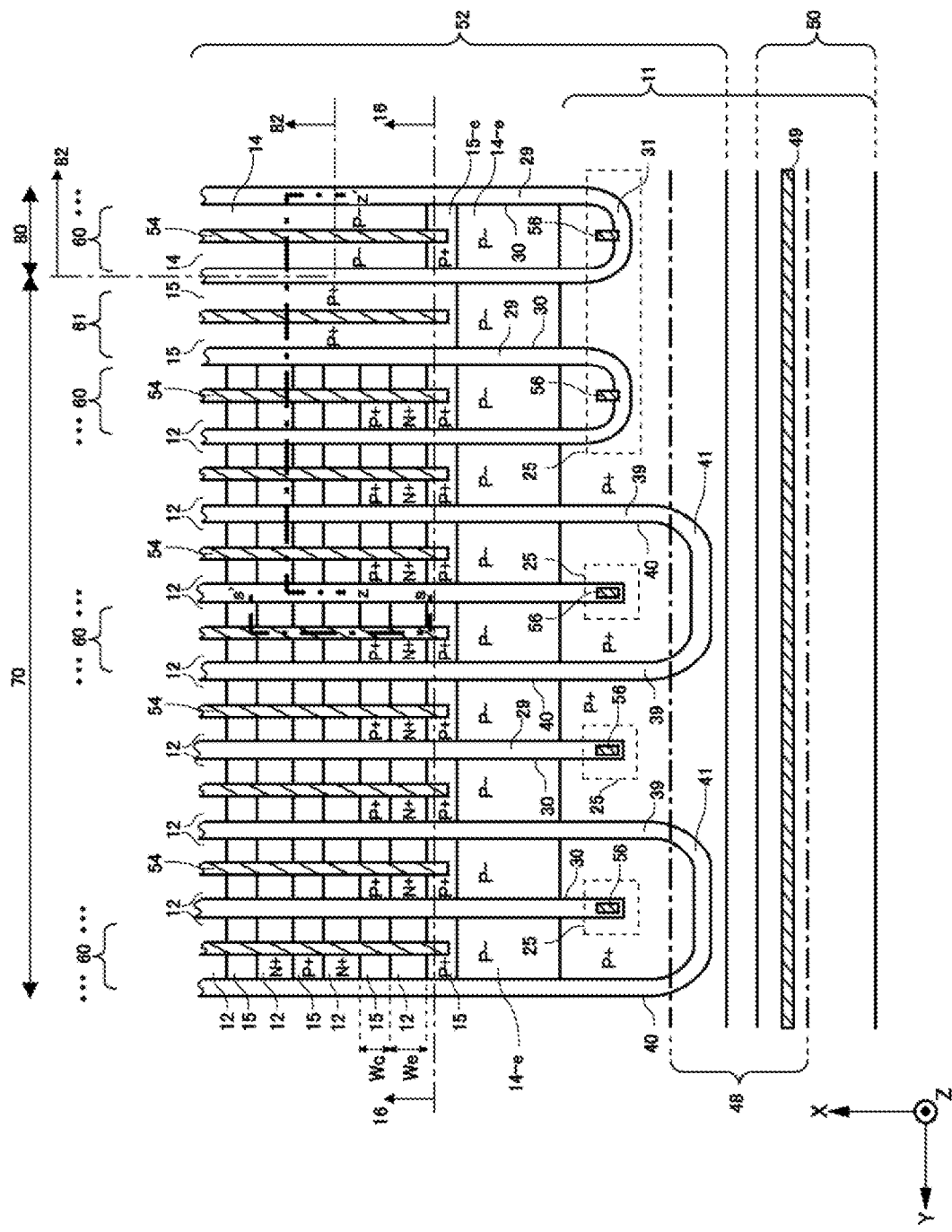
FIG. 3 is a figure showing a part of the upper surface of a semiconductor apparatus 150 in a comparative example.

FIG. 3 shows a comparative example in which the base regions 14 in FIG. 1 do not have high concentration base regions 14-2. In a semiconductor apparatus 150 of the comparative example, high concentration base regions 14-2 are not provided in regions corresponding to the high concentration base regions 14-2 in FIG. 1.

Figure 4:
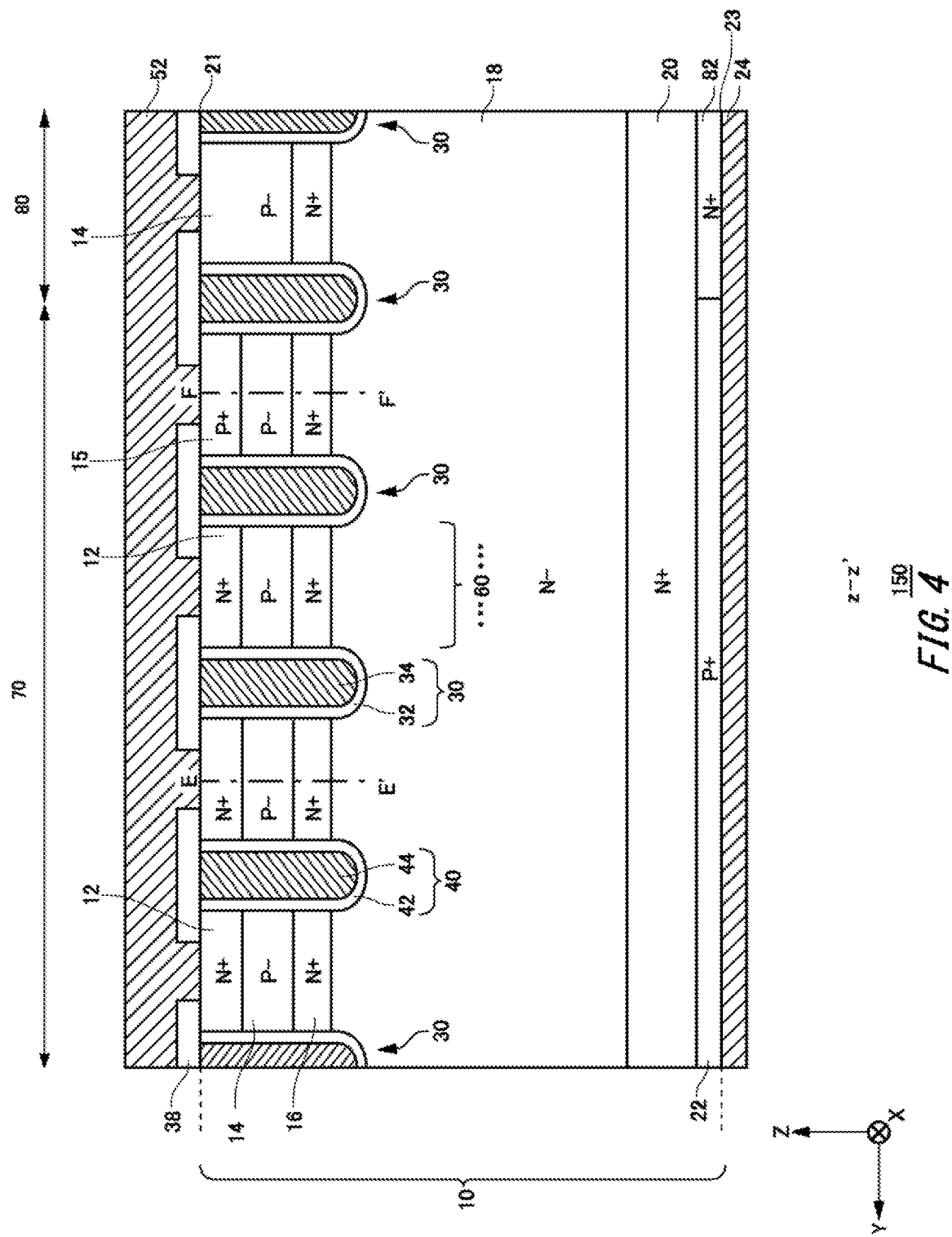
FIG. 4 is a figure showing one example of a cross section taken along a-a' in FIG. 3.

FIG. 4 is a figure showing one example of a cross section taken along z-z' in FIG. 3. In the semiconductor apparatus 150 of the comparative example, a P-type base region 14 provided between the upper surface 21 of the semiconductor substrate 10 and the drift region 18 consists of a low concentration base region 14-1.

Figure 5:
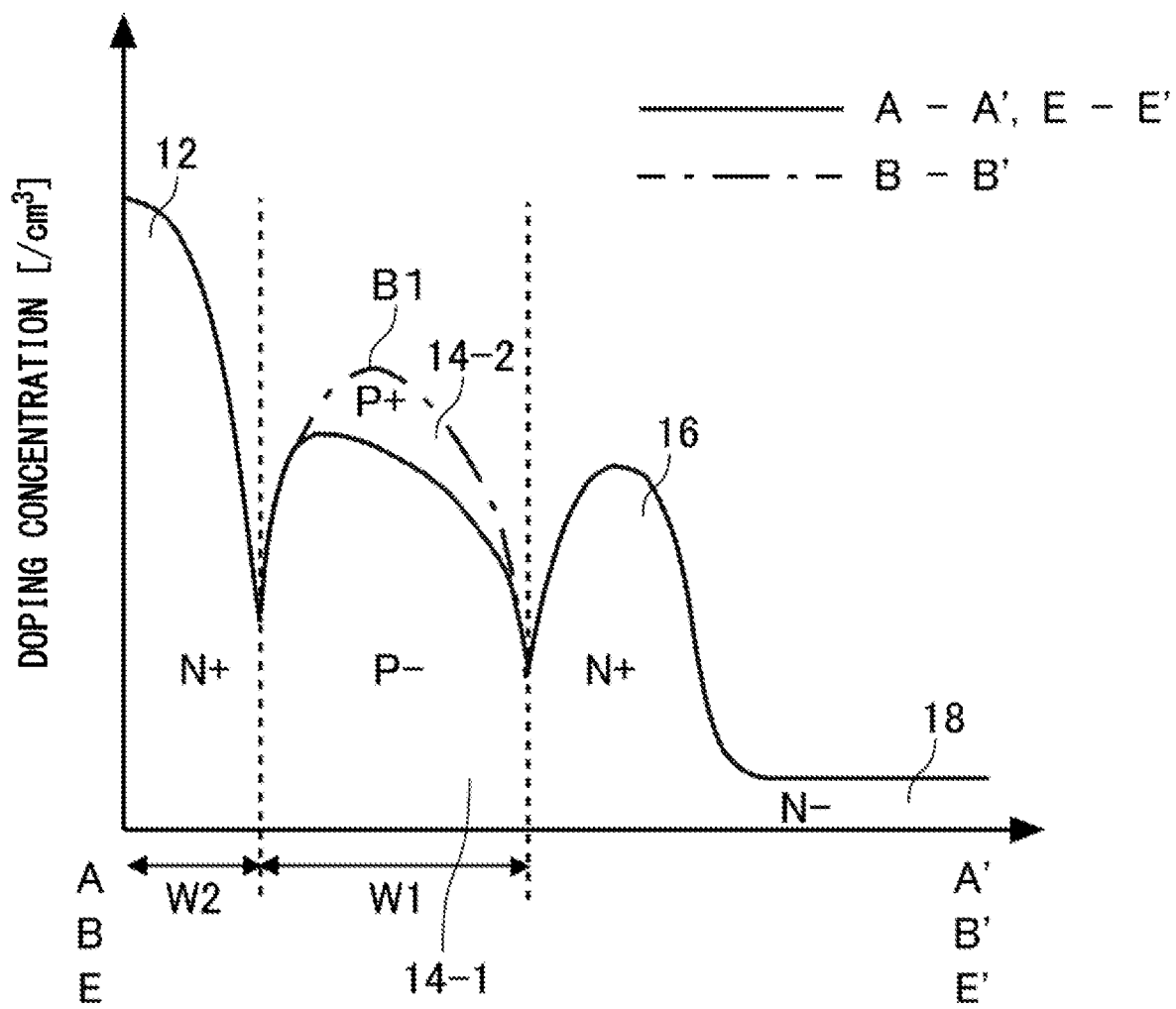
FIG. 5 is a figure showing one example of doping concentration distributions in a cross section taken along A-A' and a cross section taken along B-B' shown in FIG. 2.

FIG. 5 is a figure showing one example of doping concentration distributions in a cross section taken along A-A' and a cross section taken along B-B' in FIG. 2. In the cross section taken along A-A', a low concentration base region 14-1 is provided between an emitter region 12 and an accumulation region 16 in the Z-axis direction. In the cross section taken along B-B', a high concentration base region 14-2 is provided between the emitter region 12 and the accumulation region 16 in the Z-axis direction. In the present example, the doping concentration distribution of the low concentration base region 14-1 in the cross section taken along A-A' has a peak of the doping concentration on the side close to the emitter region 12. On the other hand, the doping concentration distribution of the high concentration base region 14-2 in the cross section taken along B-B' has a peak at a position deeper than the position of the peak in the low concentration base region 14-1.

In the present example, in the base region 14, the doping concentration distribution in the cross section taken along B-B' has a peak (B1) higher than the concentration distribution in the cross section taken along A-A'. The concentration at the peak B1 of the doping concentration of the high concentration base region 14-2 in the cross section taken along B-B' may be higher than the peak concentration of the accumulation region 16. On the other hand, because the doping concentration distribution in the cross section taken along E-E' in the comparative example of FIG. 4 is similar to the concentration distribution in the cross section taken along A-A' in FIG. 2, it does not have the peak (B1) seen in the concentration distribution in the cross section taken along B-B' in FIG. 2.

One example of the dopant for the emitter regions 12 is arsenic (As). One example of the dopant for the base regions 14 is boron (B). Because the semiconductor apparatus 100 in the present example has high concentration base regions 14-2 in base regions 14, the base resistance of the semiconductor apparatus 100 can be lowered as compared to the example of FIG. 3 and FIG. 4. Because of this, the semiconductor apparatus 100 in the present example can suppress latch-ups while at the same time improving the saturation current characteristics by increasing the width We of the emitter regions 12 in the X-axis direction in FIG. 1.

Figure 6:
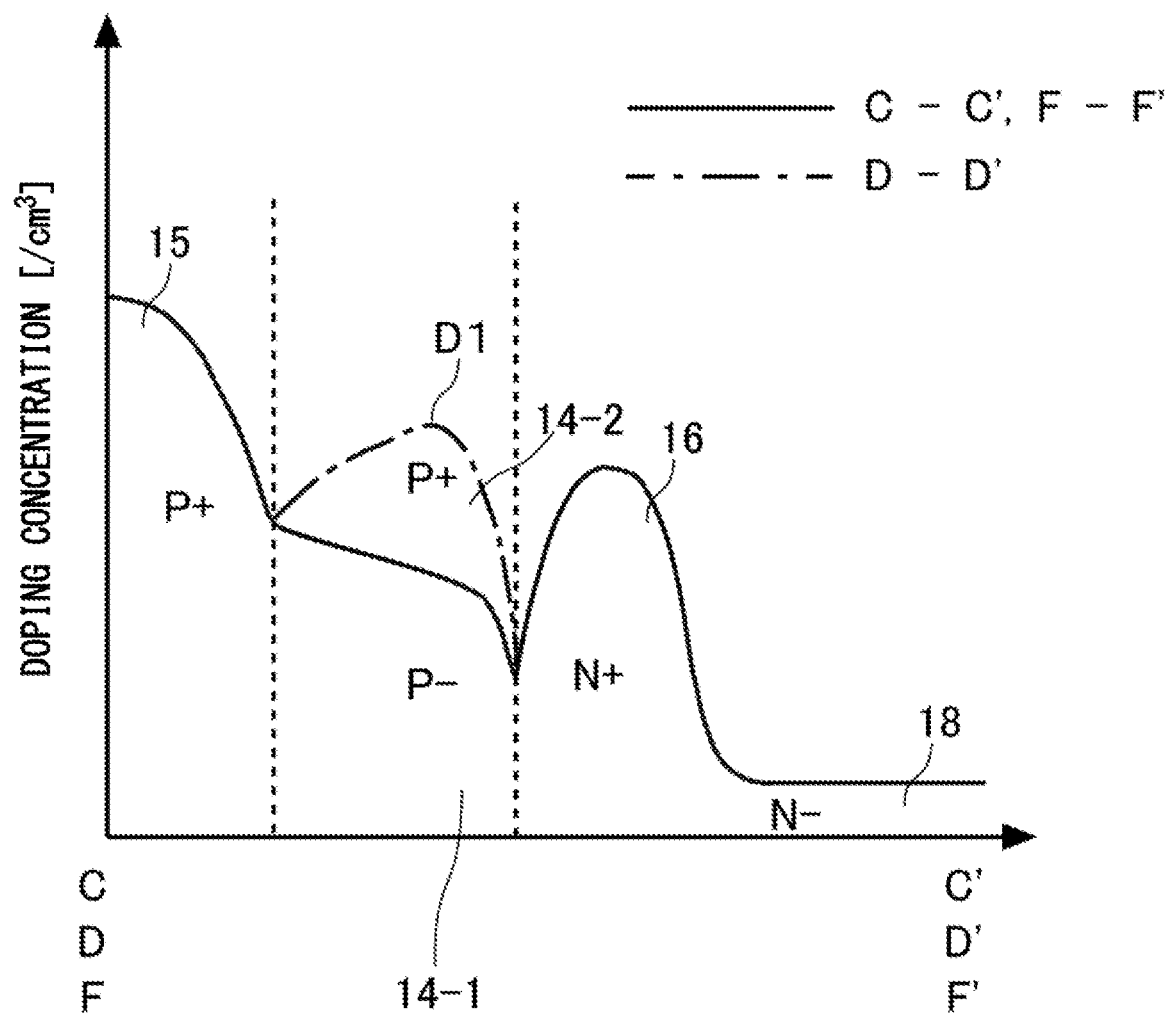
FIG. 6 is a figure showing one example of doping concentration distributions in a cross section taken along C-C' and a cross section taken along D-D' shown in FIG. 2.

FIG. 6 is a figure showing one example of the doping concentration in a cross section taken along C-C' and a cross section taken along D-D' in FIG. 2. In the cross section taken along C-C', a low concentration base region 14-1 is provided between a contact region 15 and an accumulation region 16 in the Z-axis direction. In the cross section taken along D-D', a high concentration base region 14-2 is provided between the contact region 15 and the accumulation region 16 in the Z-axis direction. In the present example, in the doping concentration distribution of the low concentration base region 14-1 in the cross section taken along C-C', the doping concentration gradually increases as the distance from the contact region 15 decreases. On the other hand, the doping concentration distribution of the high concentration base region 14-2 in the cross section taken along D-D' has a peak between the boundary between the high concentration base region 14-2 and the contact region 15 and the boundary between the high concentration base region 14-2 and the accumulation region 16.

In the present example, in the base region 14, the doping concentration distribution in the cross section taken along D-D' has a peak (D1) higher than the doping concentration distribution in the cross section taken along C-C'. The peak (D1) in the doping concentration distribution in the cross section taken along D-D' is lower than the doping concentration distribution in the contact region 15. The concentration at the peak D1 of the doping concentration of the high concentration base region 14-2 in the cross section taken along D-D' may be higher than the peak concentration of the accumulation region 16. On the other hand, because the doping concentration distribution in the cross section taken along F-F' in the comparative example of FIG. 4 is similar to the concentration distribution in the cross section taken along C-C' in FIG. 2, it does not have the peak (D1) seen in the concentration distribution in the cross section taken along D-D' in FIG. 2.

Figure 7:
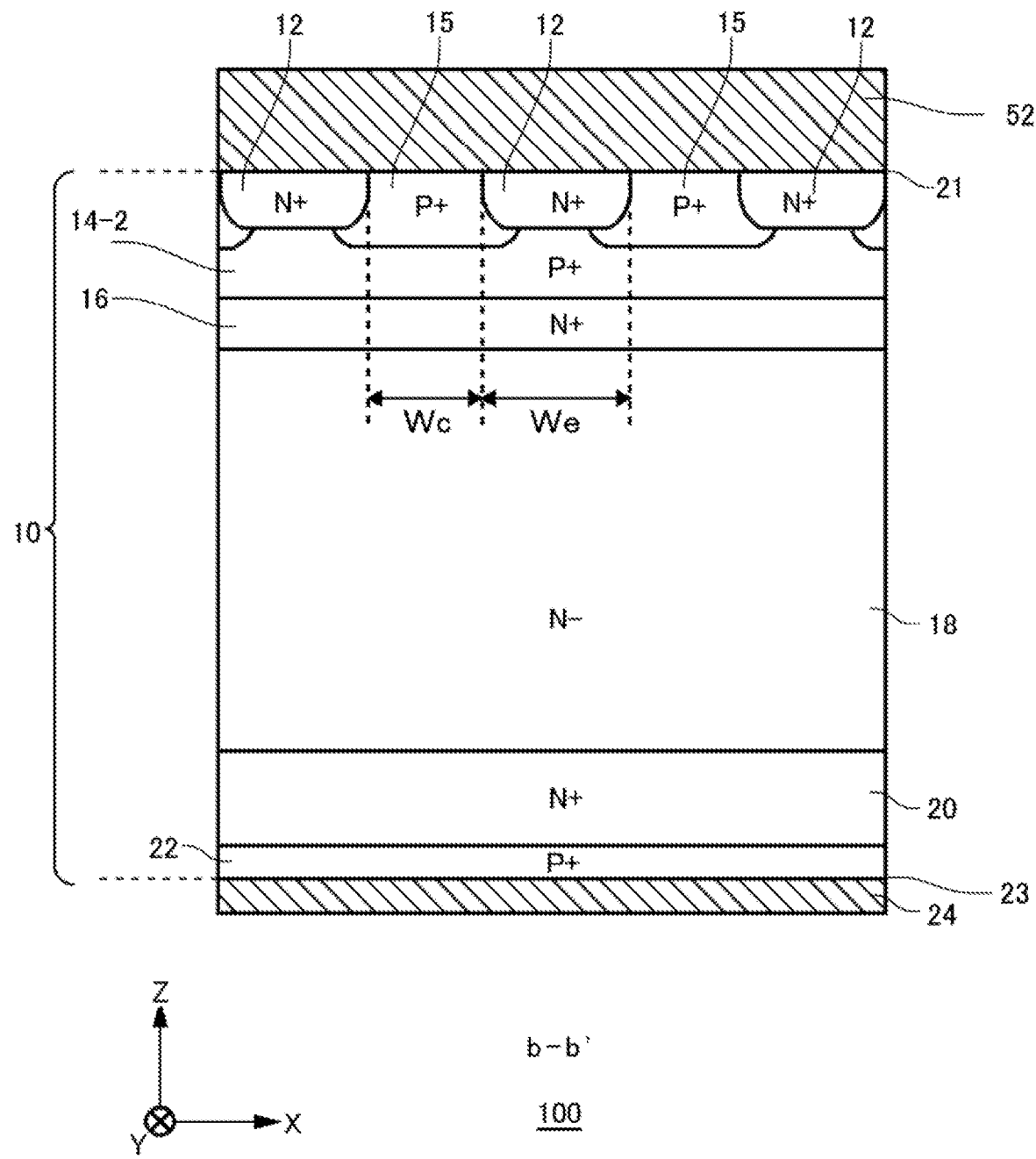
FIG. 7 is a figure showing one example of a cross section taken along b-b' in FIG. 1.

FIG. 7 is a figure showing one example of a cross section taken along b-b' in FIG. 1. The cross section taken along b-b' is an XZ plane through a contact hole 54 in the transistor portion 70. The semiconductor apparatus 100 in the present example has, in the cross section taken along b-b', the semiconductor substrate 10, the emitter electrode 52 and the collector electrode 24. The emitter electrode 52 is provided at the upper surface of the semiconductor substrate 10. In FIG. 1, a high concentration base region 14-2 is present in a region surrounding a part of a contact hole 54 as seen from the upper surface side of the semiconductor substrate 10. Because in the semiconductor apparatus 100 in the example of FIG. 7, the high concentration base region 14-2 is present in a base region 14, the base resistance can be lowered. Because of this, latch-ups of the semiconductor apparatus 100 can be suppressed while at the same time improving the saturation current characteristics.

Figure 8:
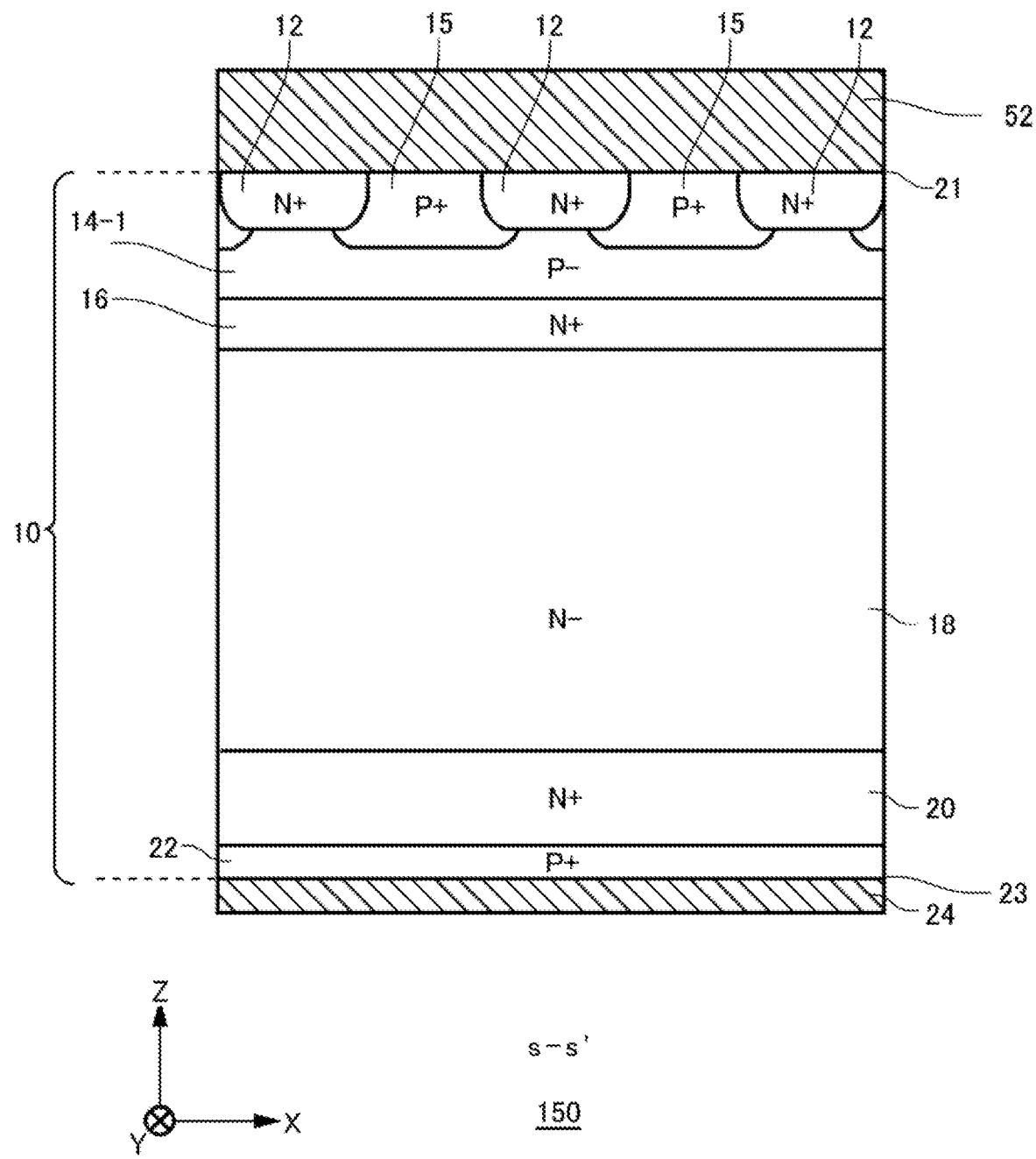
FIG. 8 is a figure showing one example of a cross section taken along s-s' in FIG. 3.

FIG. 8 is a figure showing one example of a cross section taken along s-s' in the comparative example in FIG. 3. A P-type base region 14 provided between the upper surface 21 of the semiconductor substrate 10 and the drift region 18 consists of a low concentration base region 14-1. In the semiconductor apparatus 150 of the comparative example, a high concentration base region 14-2 having a low base resistance is not present in the base region 14. Because of this, the base resistance is higher than that in the semiconductor apparatus 100 in the example of FIG. 7.

Figure 9:
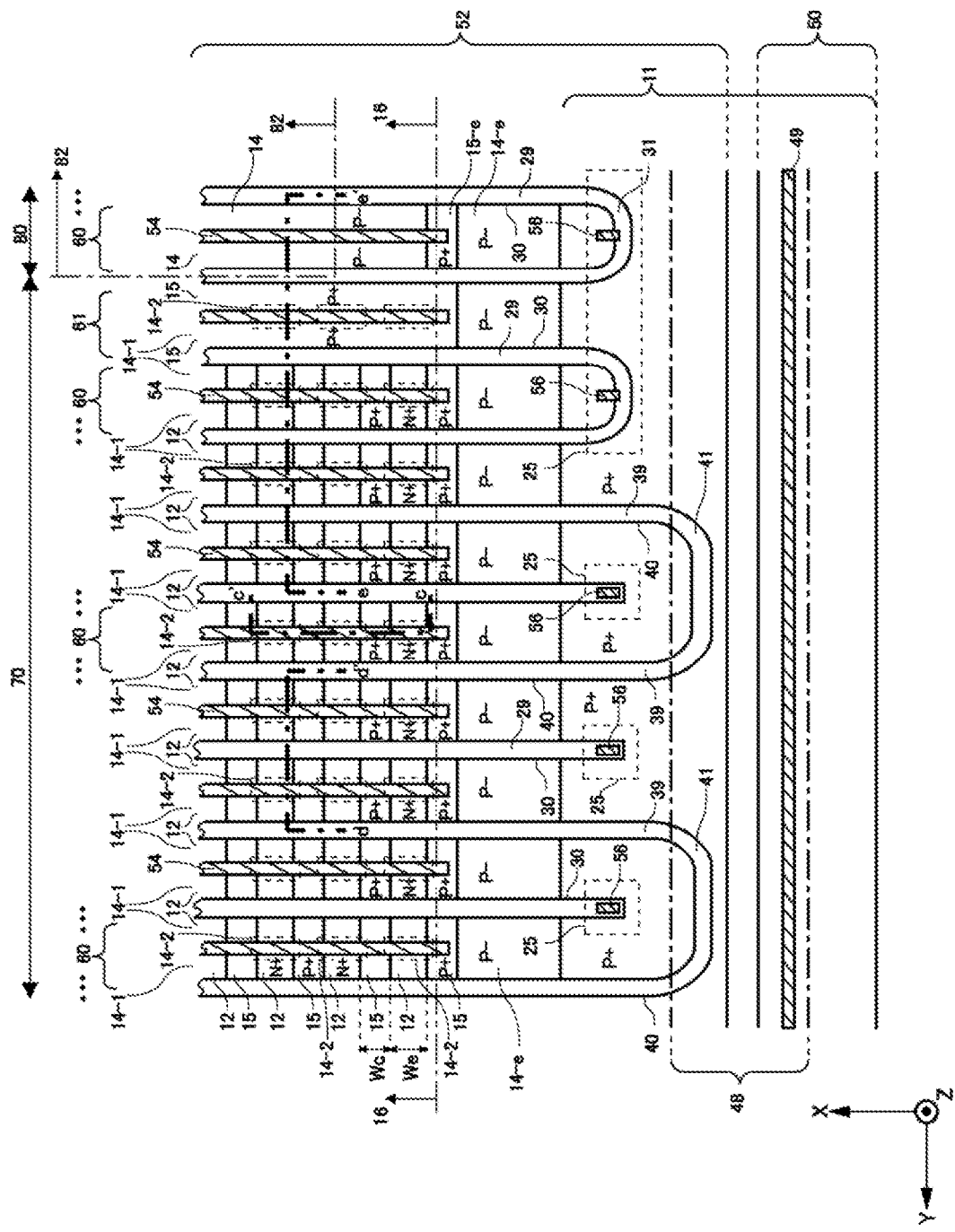
FIG. 9 is a figure showing a part of the upper surface of a semiconductor apparatus 200 according to another embodiment of the present invention.

FIG. 9 is a figure showing a part of the upper surface of a semiconductor apparatus 200 according to another embodiment of the present invention. It is different from the semiconductor apparatus 100 according to the embodiment in FIG. 1 in that a plurality of high concentration base regions 14-2 are provided discretely in the X-axis direction and low concentration base regions 14-1 are provided between the plurality of high concentration base regions 14-2 in the X-axis direction. In the present example, the width of the high concentration base regions 14-2 in the X-axis direction is larger than the width, in the X-axis direction, of emitter regions 12 at the upper surfaces of the semiconductor substrate 10. In the present example, the width of the high concentration base regions 14-2 in the X-axis direction is smaller than the width of mesa portions 60. In addition, in the present example, the width of the high concentration base regions 14-2 in the Y-axis direction is larger than the width of contact holes 54 in the Y-axis direction.

Figure 10:
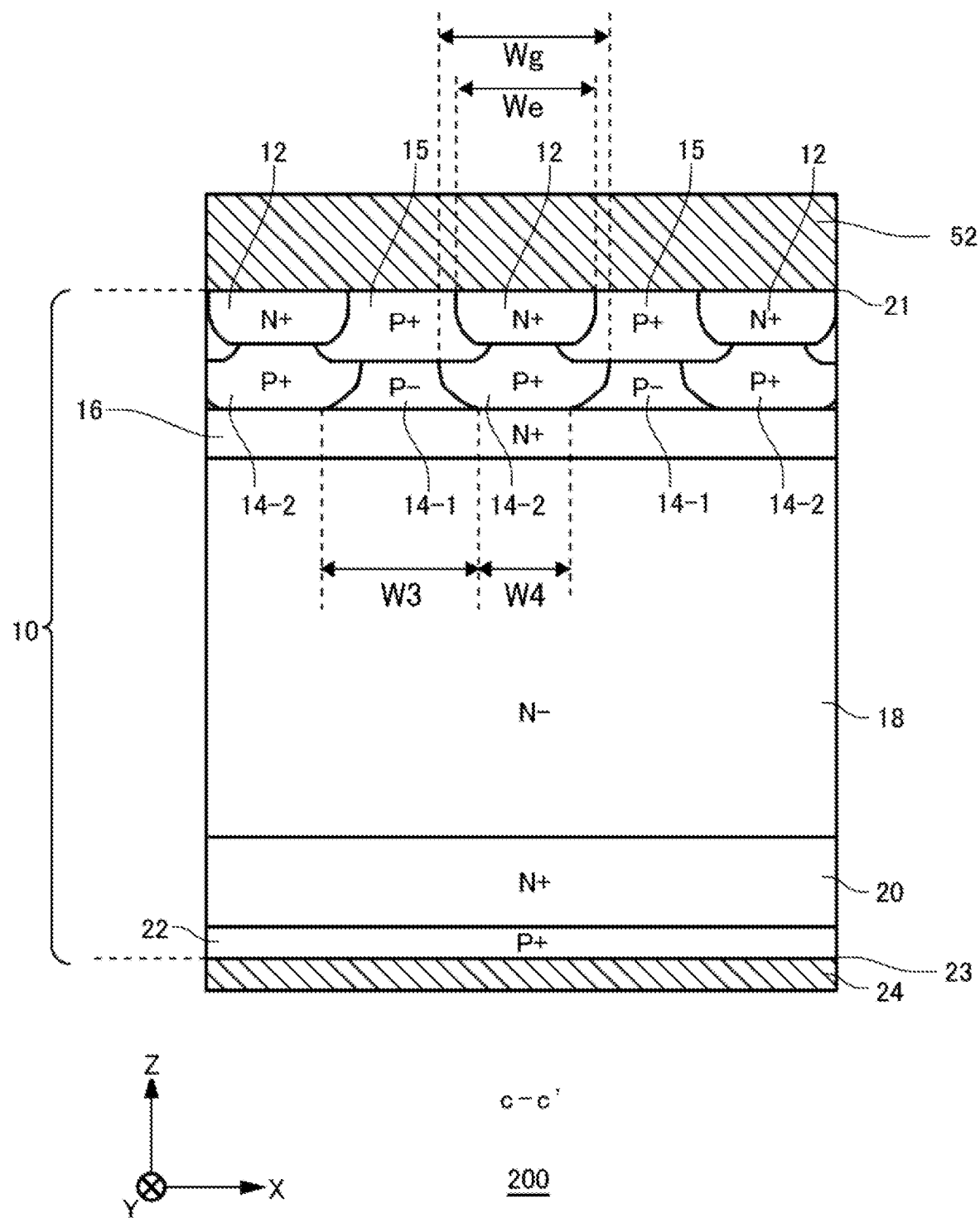
FIG. 10 is a figure showing one example of a cross section taken along c-c' in FIG. 9.

FIG. 10 is a figure showing one example of a cross section taken along c-c' in FIG. 9. The cross section taken along c-c' is an XZ plane through a contact hole 54 in the transistor portion 70. In the semiconductor apparatus 100 in the present example, a part of a low concentration base region 14-1 may be provided in contact with high concentration base regions 14-2 in the X-axis direction and below a contact region 15. The width W3 of a high concentration base region 14-2 in contact with the accumulation region 16 may be larger than the width W4 of a low concentration base region 14-1 in contact with the accumulation region 16.

The width Wg of a high concentration base region 14-2 in contact with a contact region 15 may be larger than the width We of an emitter region 12 at the upper surface 21. Thereby, the resistance of a path through which holes flow from below emitter regions 12 to contact regions 15 can be made remarkably lower than the resistance of base regions. Because of this, the latch-up suppression effect can be enhanced.

A process of doping to high concentration base regions 14-2 may be performed using a mask for selectively forming the high concentration base regions 14-2. The process of doping to the high concentration base regions 14-2 may be performed after a process of doping to a contact region 15 that is in the diode portion 80 and arranged closest to the transistor portion 70 side in FIG. 9.

Figure 11:
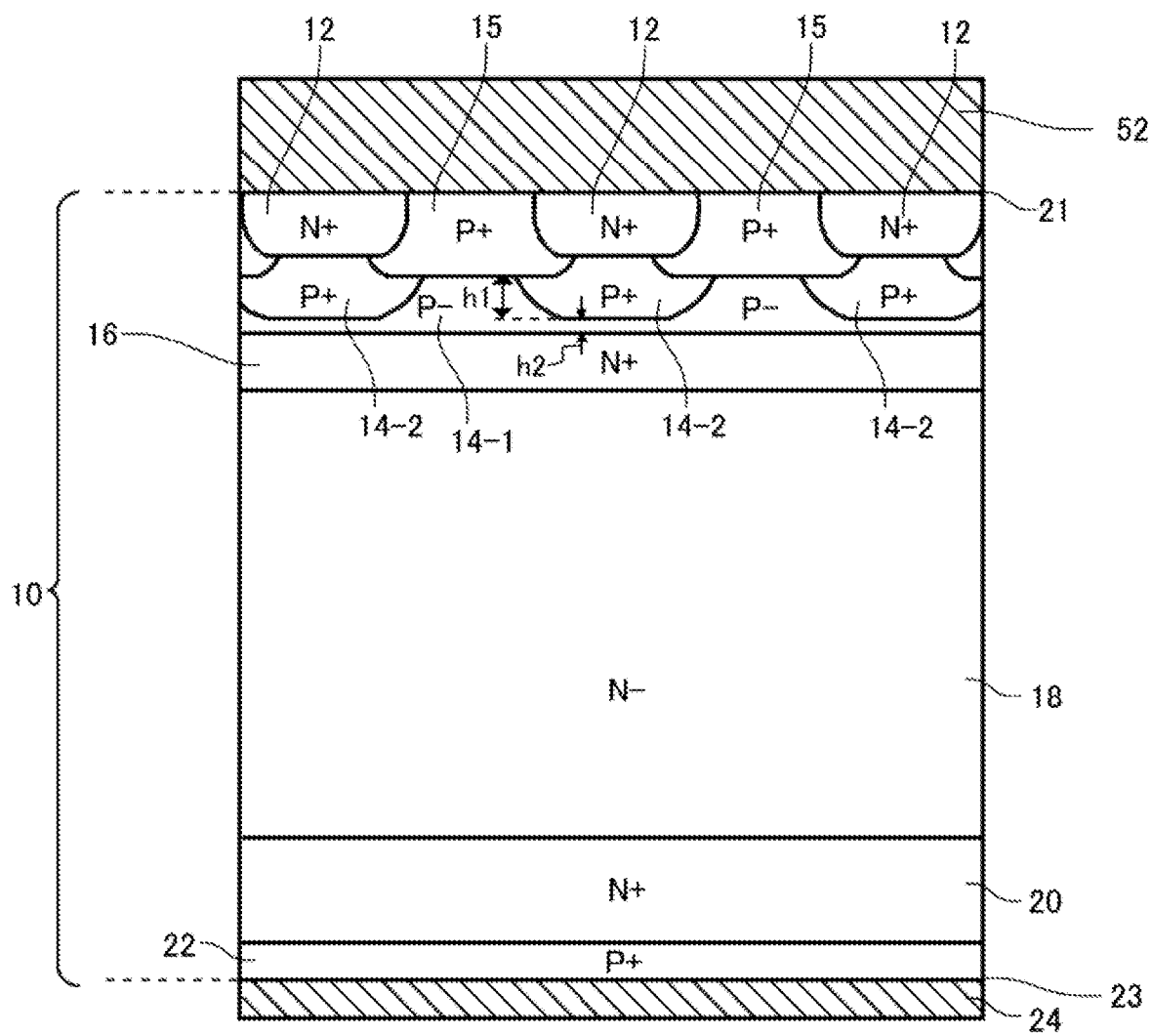
FIG. 11 is a figure showing one example of the cross section taken along c-c' in FIG. 9, in which a low concentration base region 14-1 is provided between an accumulation region 16 and high concentration base regions 14-2.

FIG. 11 is a figure showing one example of FIG. 10, in which a low concentration base region 14-1 is provided between the accumulation region 16 and high concentration base regions 14-2. In the semiconductor apparatus 200 in the present example, the low concentration base region 14-1 may be provided between the accumulation region 16 and the high concentration base regions 14-2.

The depth of the low concentration base region 14-1 from the bottom surfaces of the contact regions 15 to the bottom surfaces of the high concentration base regions 14-2 are defined as a depth h1. The depth of the low concentration base region 14-1 from the bottom surfaces of the high concentration base regions 14-2 to the upper surface of the accumulation region 16 is defined as a depth h2. The depth h1 may be larger than the depth h2.

Figure 12:
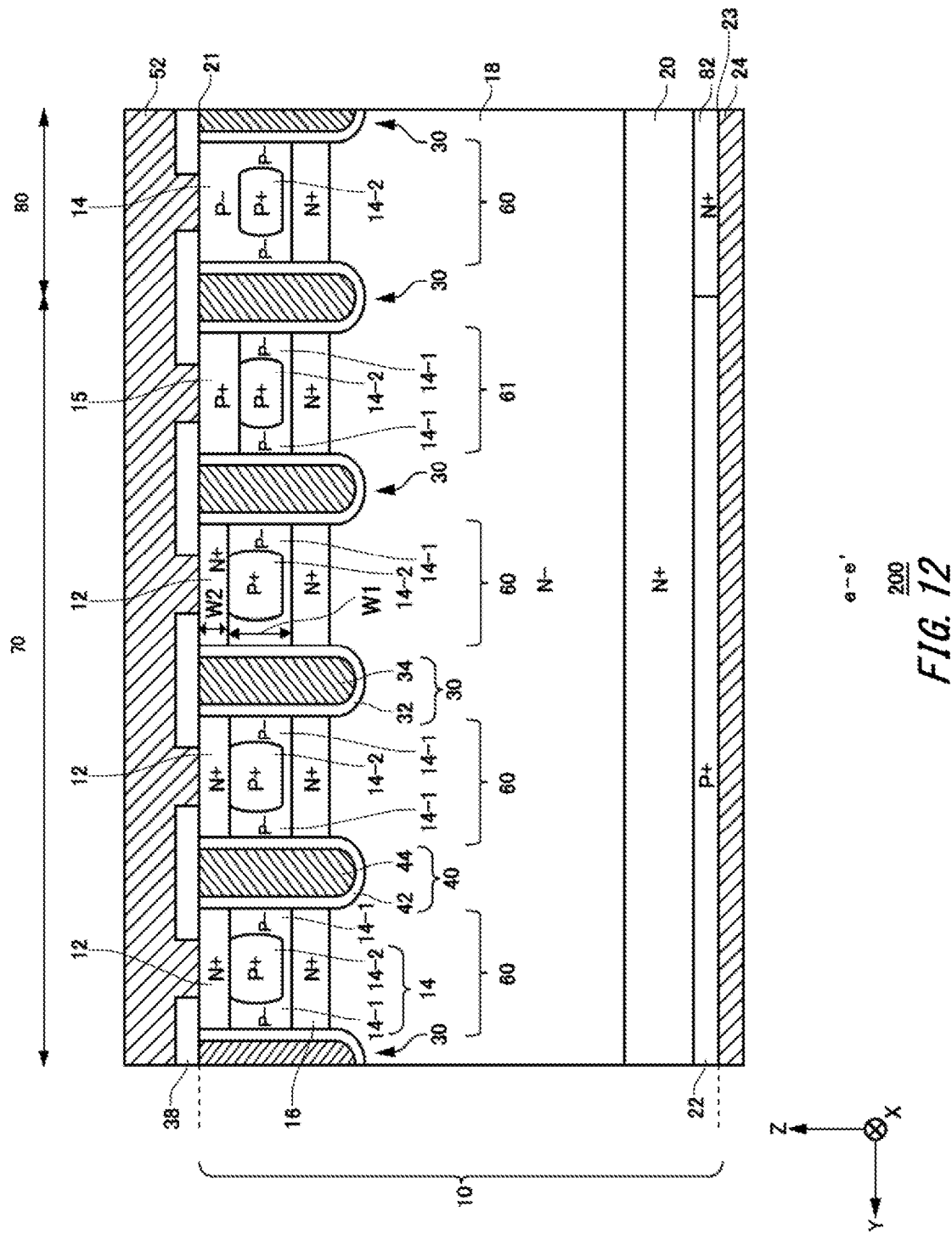
FIG. 12 is a figure showing one example of a cross section taken along e-e' in FIG. 9.

FIG. 12 is a figure showing one example of a cross section taken along e-e' in FIG. 9. FIG. 12 is a cross sectional view on a YZ plane of one example shown in FIG. 11. In the example shown in FIG. 12, similar to the example shown in FIG. 11, low concentration base regions 14-1 are provided between accumulation regions 16 and high concentration base regions 14-2. As shown in FIG. 9, the cross section taken along e-e' is a YZ plane passing through emitter regions 12. In the cross section taken along e-e' also, the depth h1 may be larger than the depth h2. By providing the low concentration base regions 14-1 between the high concentration base regions 14-2 and the accumulation regions 16, the electric field strength at the OFF-state can be relaxed.

Figure 13:
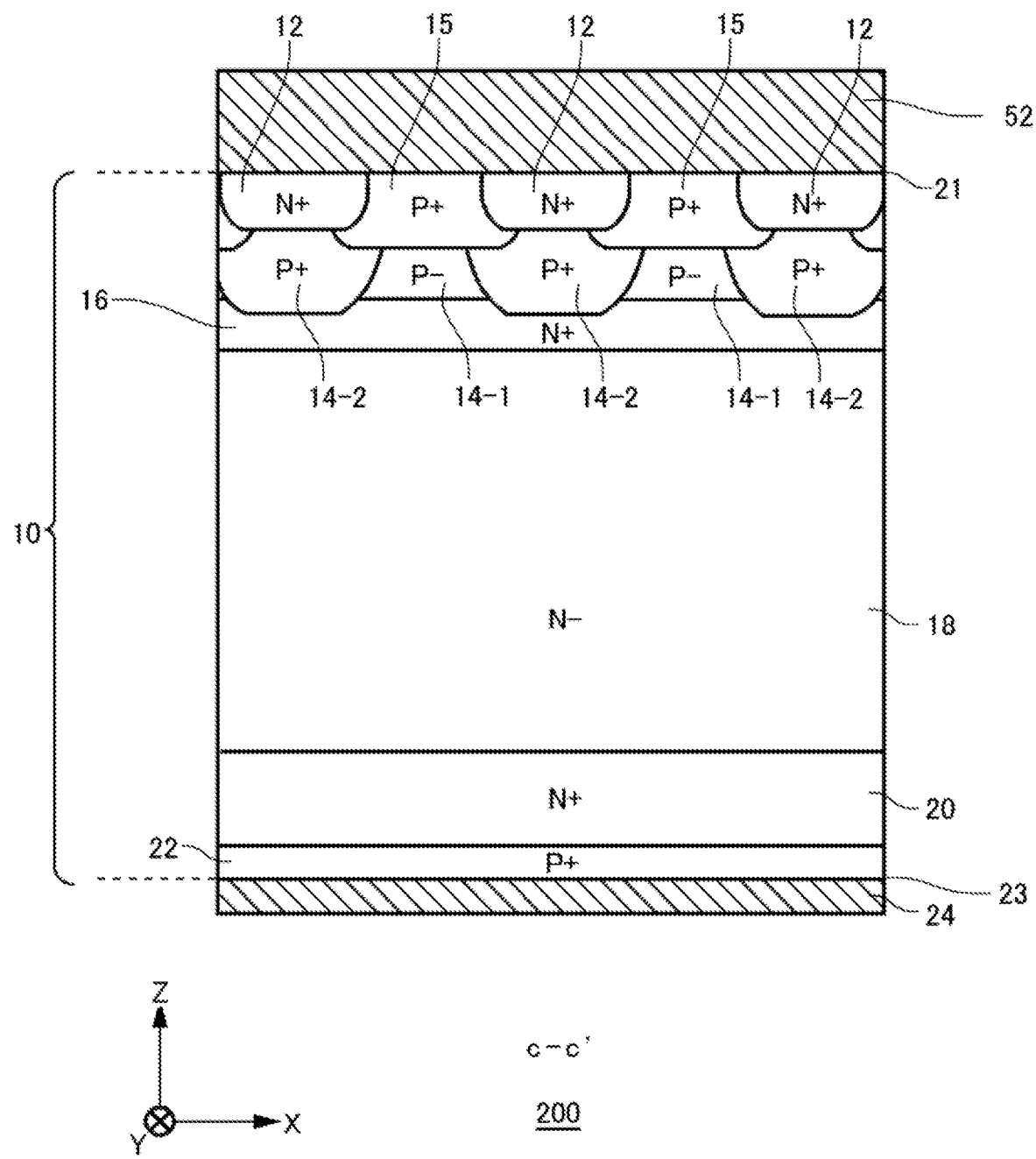
FIG. 13 is a figure showing one example of the cross section taken along c-c' in FIG. 9, in which high concentration base regions 14-2 protrude toward the accumulation region 16.

FIG. 13 is a figure showing one example of FIG. 10, in which high concentration base regions 14-2 protrude toward the accumulation region 16 (depth direction). As shown in FIG. 13, the high concentration base regions 14-2 may protrude toward the accumulation region 16 than low concentration base regions 14-1 do.

Figure 14:
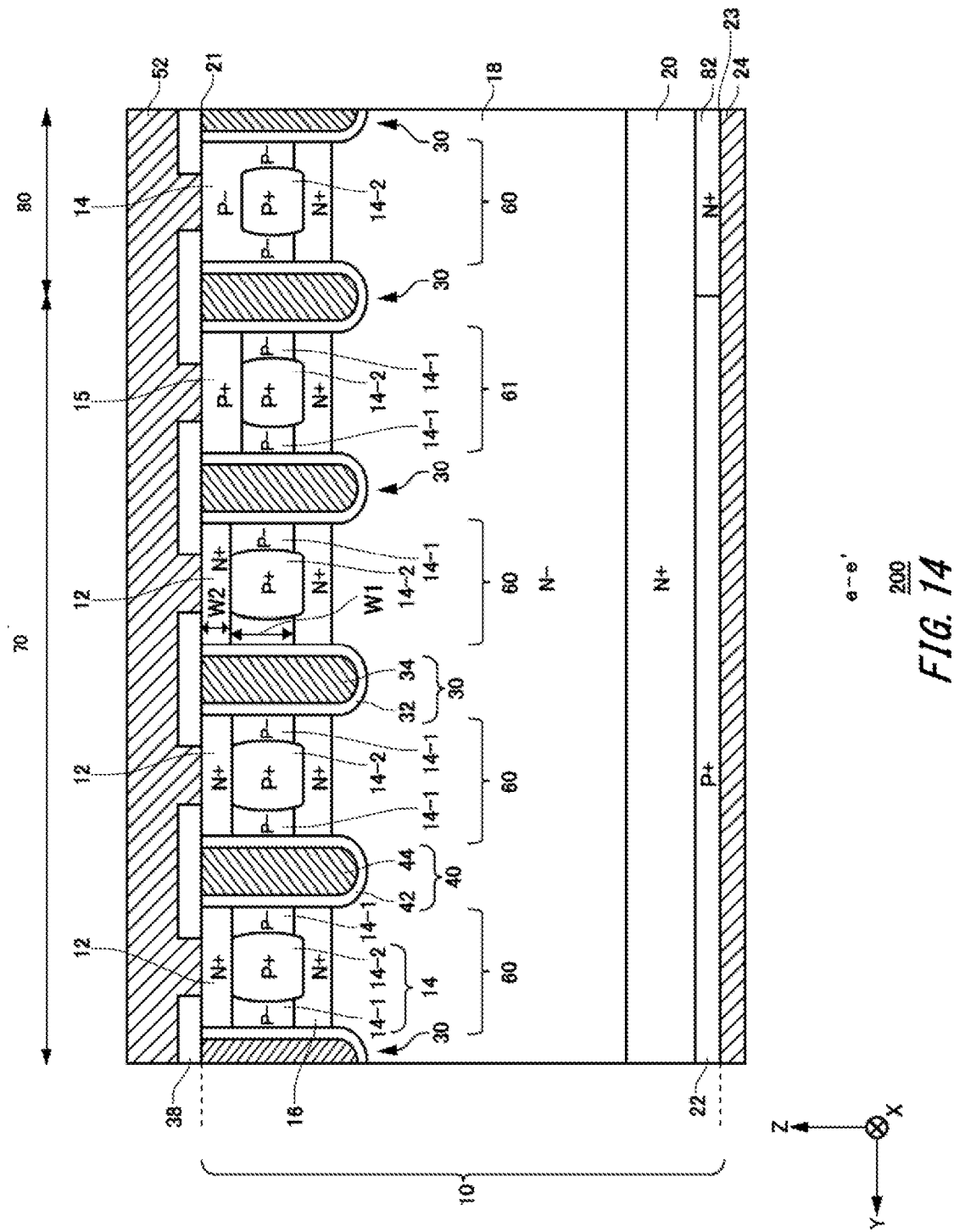
FIG. 14 is a figure showing another example of the cross section taken along e-e' in FIG. 9.

FIG. 14 is a figure showing another example of the cross section taken along e-e' in FIG. 9. FIG. 14 is a cross sectional view on a YZ plane in one example shown in FIG. 13. In the example shown in FIG. 14, similar to the example shown in FIG. 13, high concentration base regions 14-2 protrude toward the accumulation regions 16 (in the depth direction). As shown in FIG. 14, in the cross section taken along e-e' also, the high concentration base regions 14-2 may protrude toward the accumulation region 16 than low concentration base regions 14-1 do.

As shown in FIG. 10, FIG. 11 and FIG. 13, high concentration base regions 14-2 may be provided in contact with contact regions 15. By providing the low base resistance high concentration base regions 14-2 in contact with the contact regions 15, the resistance of an electrical path from the collector region 22 to the contact regions 15 is lowered. Because of this, latch-ups of the semiconductor apparatus 200 can be suppressed.

Figure 15:
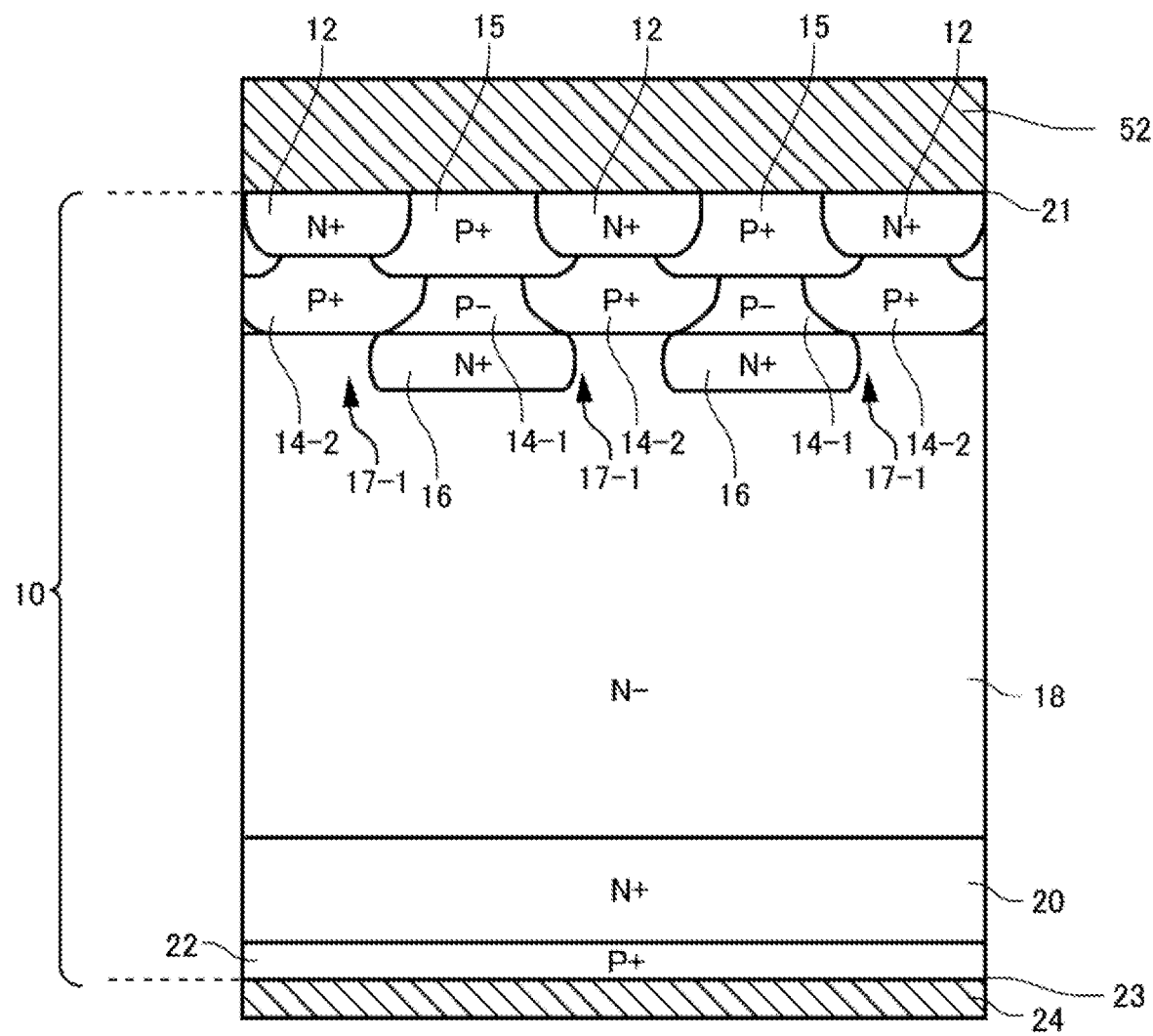
FIG. 15 is a figure showing one example of the cross section taken along c-c' in FIG. 9, in which a drift region 18 is in contact with high concentration base regions 14-2 below emitter regions 12 through first openings 17-1.

FIG. 15 is a figure showing one example in which the accumulation region 16 in FIG. 10 has first openings 17-1. In the present example, the drift region 18 may be in contact with high concentration base regions 14-2 below emitter regions 12 through the first openings 17-1. In the present example, the accumulation region 16 may not be present in at least parts of regions below the emitter regions 12. In the example of FIG. 15, because the contact regions 15 and the high concentration base regions 14-2 are in contact with each other, the resistance of a path through which holes flows from regions below the emitter regions 12 to the contact regions 15 can be lowered. Because of this, latch-ups of the semiconductor apparatus 200 can be suppressed. In addition, because the high concentration base regions 14-2 and the accumulation region 16 are not in contact with each other, an increase in the electric field strength can be suppressed.

Figure 16:
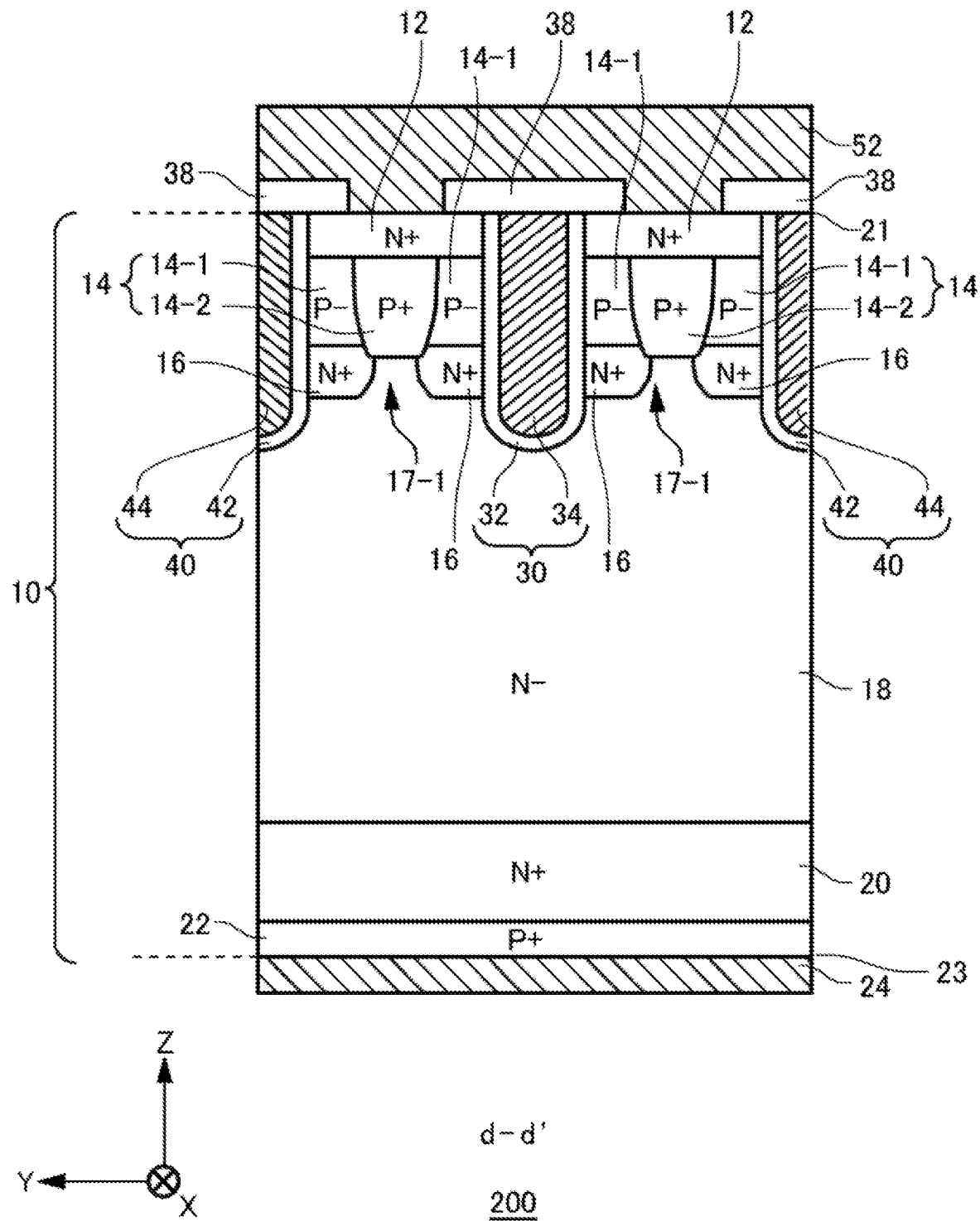
FIG. 16 is a figure showing one example of a cross section taken along d-d' in FIG. 9.

FIG. 16 is a figure showing one example of a cross section taken along d-d' in FIG. 9. As shown in FIG. 16, first openings 17-1 are provided apart from gate trench portions 40 and a dummy trench portion 30. In the present example, the drift region 18 may be in contact with high concentration base regions 14-2 below emitter regions 12 through the first openings 17-1. In the present example, accumulation regions 16 may not be present in at least parts of regions below the emitter regions 12.

Figure 17:
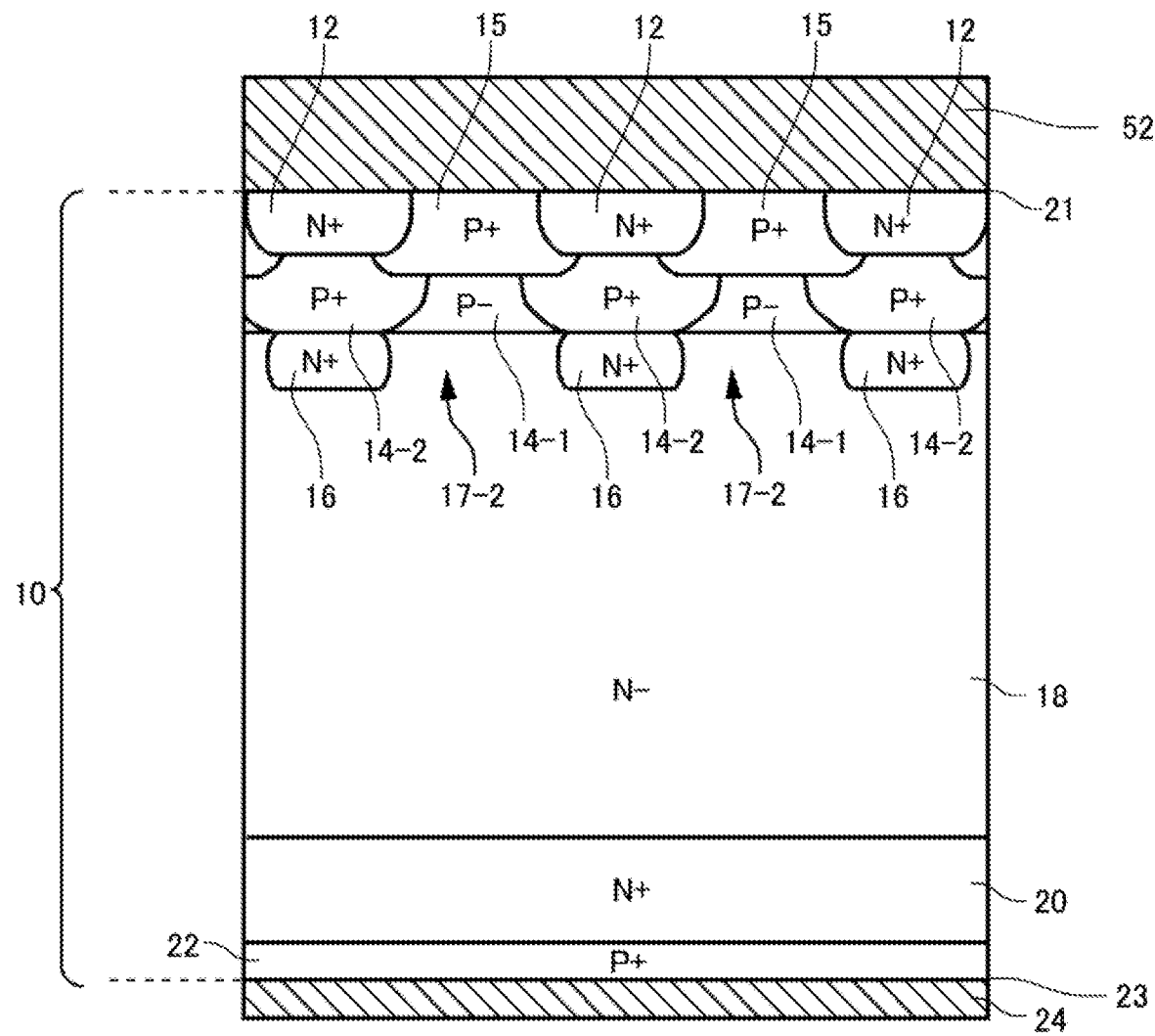
FIG. 17 is a figure showing one example of the cross section taken along c-c' in FIG. 9, in which the drift region 18 is in contact with low concentration base regions 14-1 below emitter regions 12 through second openings 17-2.

FIG. 17 is a figure showing one example in which the accumulation region 16 in FIG. 10 has second openings 17-2. In the present example, the drift region 18 may be in contact with low concentration base regions 14-1 below the emitter regions 12 through the second openings 17-2. In the semiconductor apparatus 200 in the present example, the accumulation region 16 may not be present in at least parts of regions below contact regions 15. In the example of FIG. 17, because the accumulation region 16 is in contact with high concentration base regions 14-2 therebelow, holes in the ON-state become concentrated in a region around the emitter regions 12. Because similar to the example of FIG. 10, holes easily flow into the high concentration base regions 14-2, the resistance of a path through which the holes flows from regions below the emitter regions 12 to the contact regions 15 can be lowered. Because of this, latch-ups of the semiconductor apparatus 100 can be suppressed.

Figure 18:
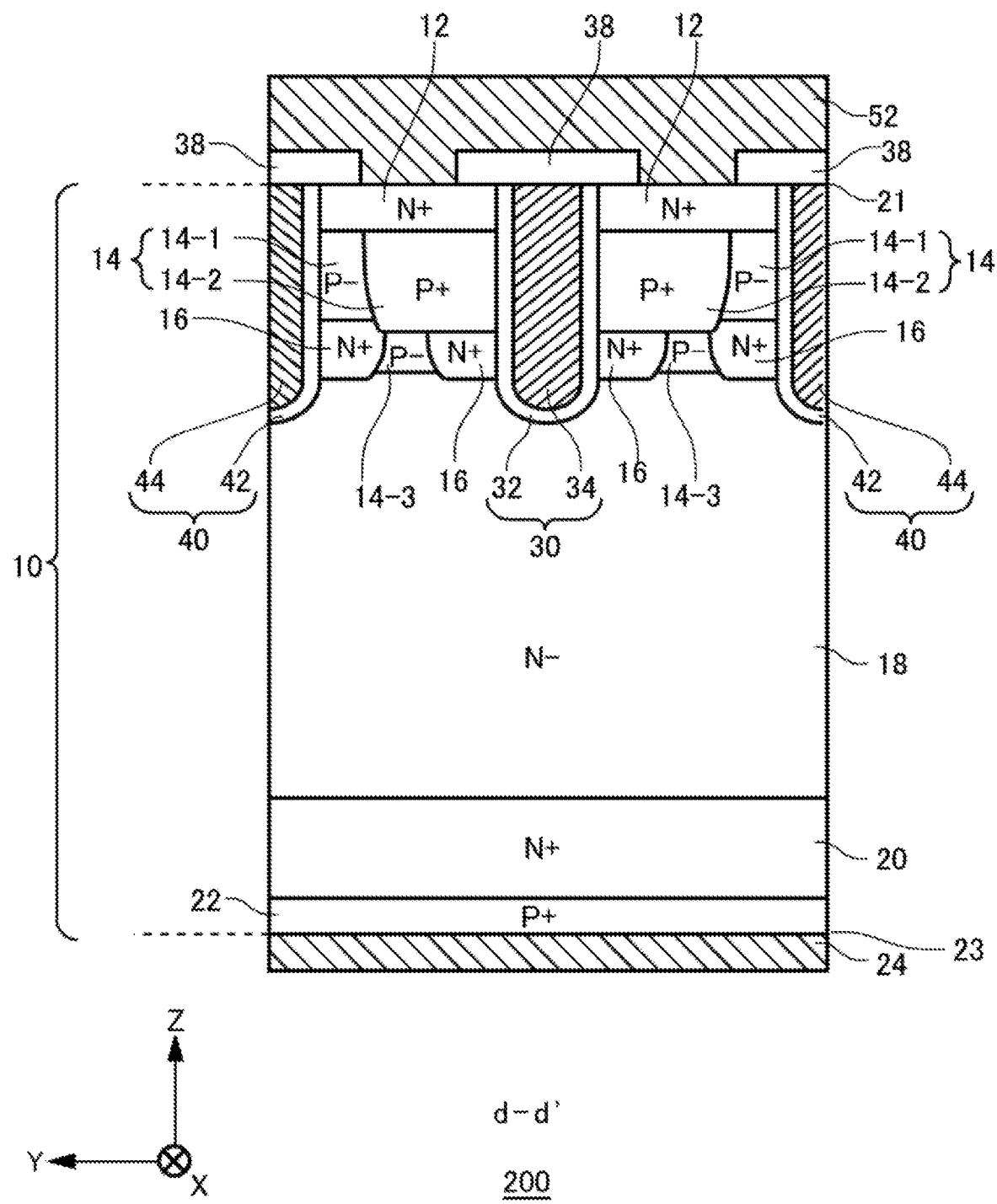
FIG. 18 is a figure showing one example of the cross section taken along d-d' in FIG. 9, in which high concentration base regions 14-2 are provided in contact with a dummy trench portion 30.

FIG. 18 is a figure showing one example of the cross section taken along d-d' in FIG. 9, in which high concentration base regions 14-2 are provided in contact with a dummy trench portion 30. As shown in FIG. 18, base regions 14 in contact with the dummy trench portion 30 may not be low concentration base regions 14-1. In addition, second conductivity-type intermediate regions 14-3 may be provided in parts of regions that constitute accumulation regions 16 and are not in contact with gate trench portions 40 and the dummy trench portion 30.

Figure 19:
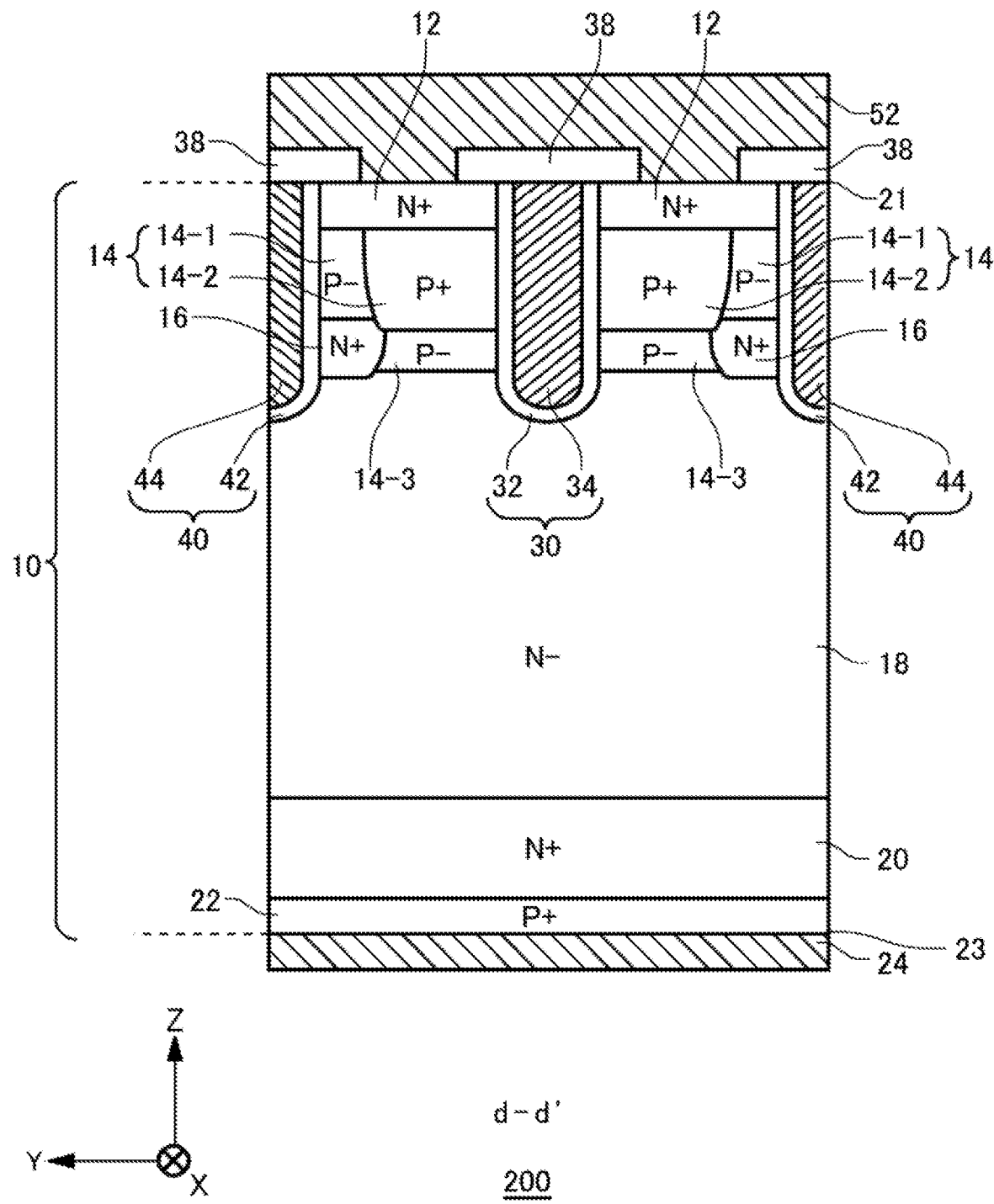
FIG. 19 is a figure showing one example of FIG. 18, in which second conductivity-type intermediate regions 14-3 are provided in contact with the dummy trench portion 30.

FIG. 19 is a figure showing one example of FIG. 18, in which second conductivity-type intermediate regions 14-3 are provided in contact with the dummy trench portion 30. As shown in FIG. 19, the accumulation region 16 may not be in contact with the dummy trench portion 30. Intermediate regions 14-3, high concentration base regions 14-2 and emitter regions 12 may be in contact with the dummy trench portion 30.

Figure 20:
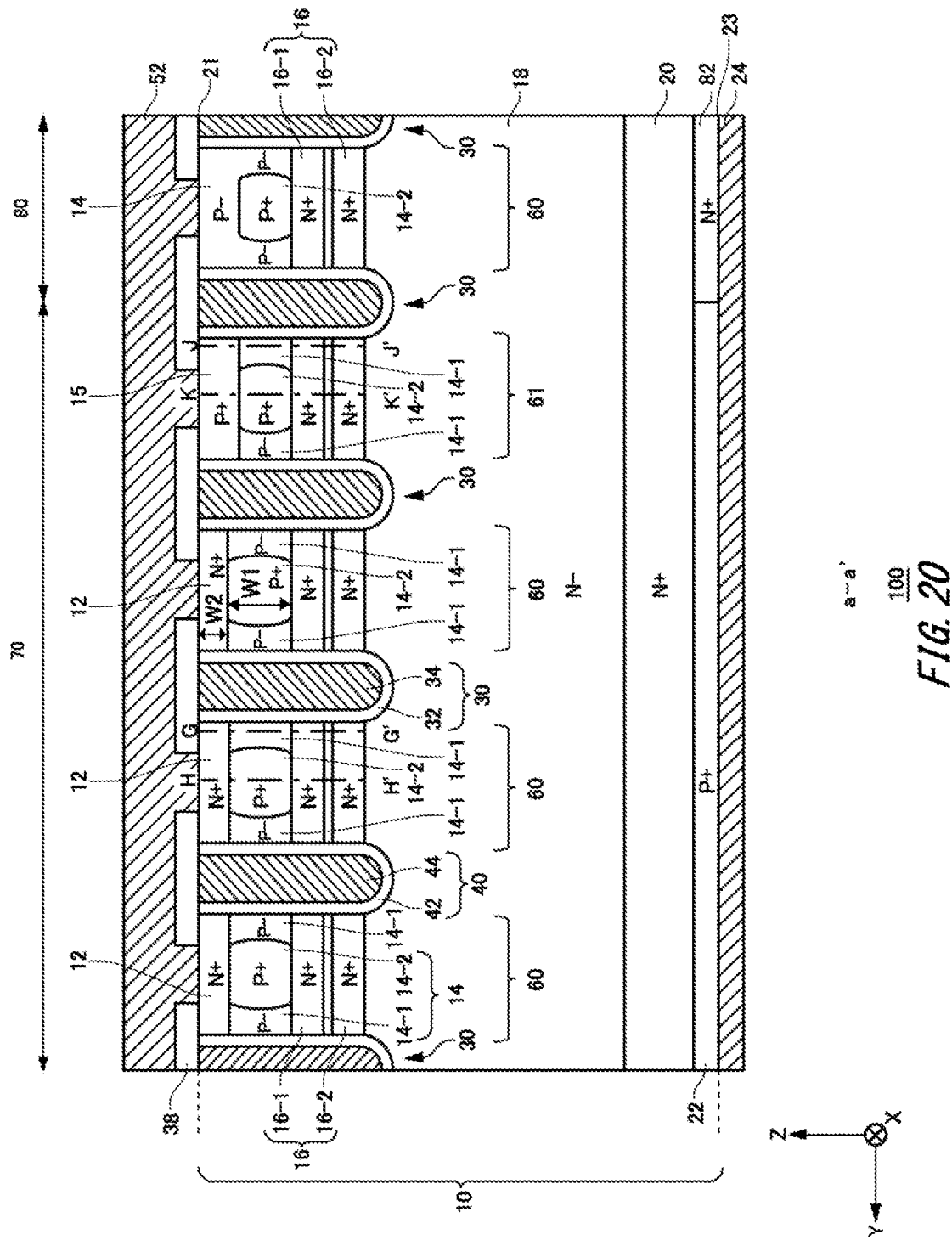
FIG. 20 is a figure showing another example of the cross section taken along a-a' in FIG. 1.

FIG. 20 is a figure showing another example of the cross section taken along a-a' in FIG. 1. The cross section taken along a-a' is a YZ plane passing through emitter regions 12 in the transistor portion 70 and diode portion 80. The semiconductor apparatus 100 in the present example is different from the semiconductor apparatus 100 shown in FIG. 2 in that a plurality of accumulation regions 16 are provided in the semiconductor apparatus 100 shown in FIG. 2. Although in the present example, the number of accumulation regions 16 provided is two, there may be three or more accumulation regions. An accumulation region 16-1 and an accumulation region 16-2 are arranged side-by-side in the Z-axis direction. In the Z-axis direction, an N-type region is provided between the accumulation region 16-1 and the accumulation region 16-2. The doping concentration in the N-type region may be lower than those of the accumulation region 16-1 and accumulation region 16-2. In addition, the doping concentration in the N-type region may be the same as or higher than the doping concentration of the drift region 18. All the accumulation regions 16 may be arranged above the lower ends of gate trench portions 40 and dummy trench portions 30.

Figure 21:
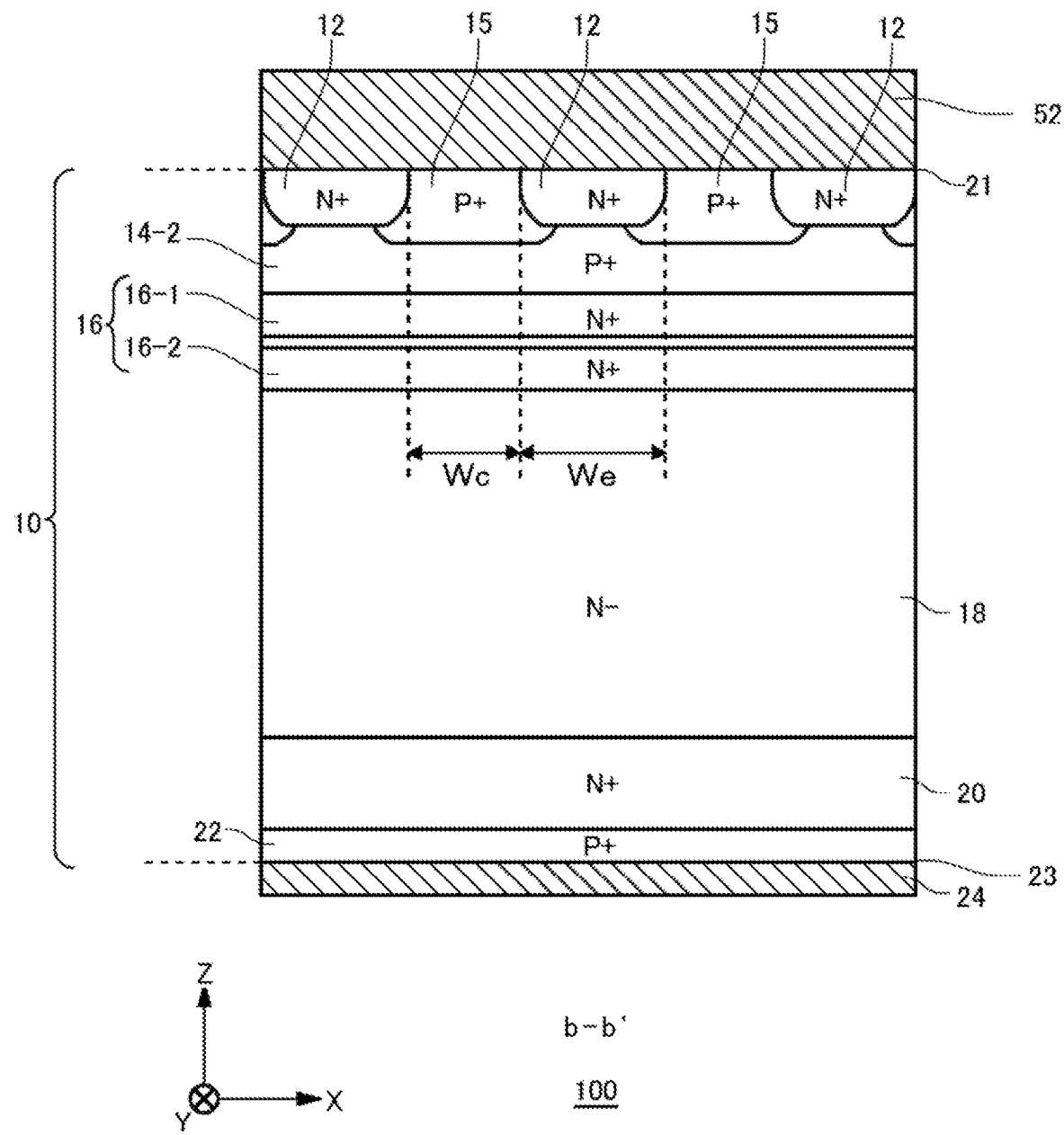
FIG. 21 is a figure showing another example of the cross section taken along b-b' in FIG. 1.

FIG. 21 is a figure showing another example of the cross section taken along b-b' in FIG. 1. The cross section taken along b-b' is an XZ plane through a contact hole 54 in the transistor portion 70. The semiconductor apparatus 100 in the present example is different from the semiconductor apparatus 100 shown in FIG. 7 in that a plurality of accumulation regions 16 are provided in the semiconductor apparatus 100 shown in FIG. 7. An accumulation region 16-1 and an accumulation region 16-2 are arranged side-by-side in the Z-axis direction. An N-type region is provided between the accumulation region 16-1 and the accumulation region 16-2. The doping concentration in the N-type region may be lower than those of the accumulation region 16-1 and accumulation region 16-2. In addition, the doping concentration in the N-type region may be the same as or higher than the doping concentration of the drift region 18.

Figure 22:
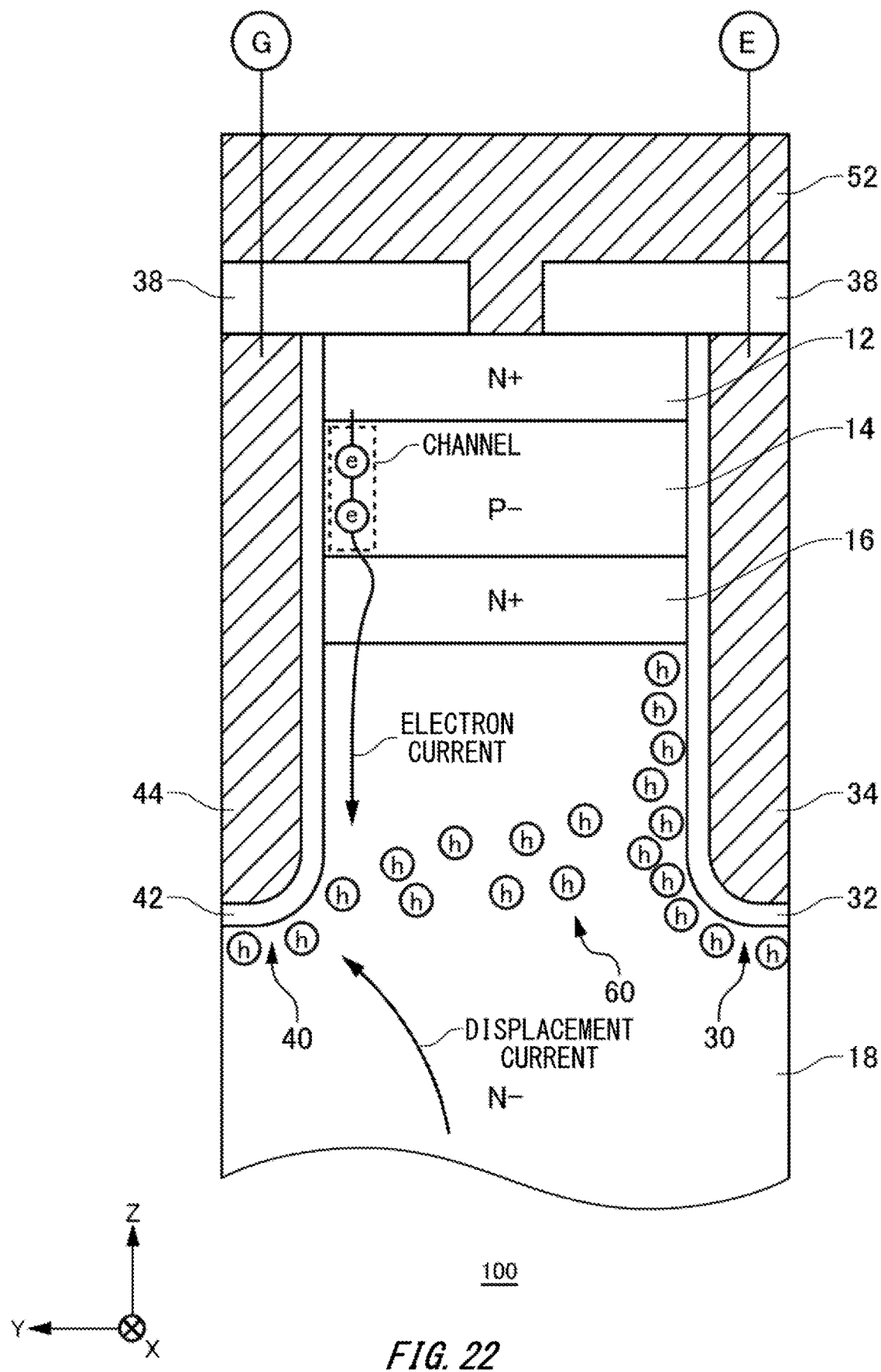
FIG. 22 is a figure showing one example of paths in a region near a mesa portion 60, through which electron current and displacement current flow in the example shown in FIG. 2.

FIG. 22 is a figure showing one example of paths in a region near a mesa portion 60, through which electron current and displacement current flow in the example shown in FIG. 2. In the present example, one accumulation region 16 is provided. In FIG. 22, current paths at the time of turn-on are shown. At the time of turn-on, voltage of a gate conductive portion 44 gradually rises from 0 (V). Thereby, a channel is formed in a region in a base region 14 and near a gate trench portion 40 because a negative charge is induced.

The main constituent of current in the initial period at the time of turn-on is not hole current, but electron current. The "initial period" is a period that begins immediately before gate voltage Vge reaches threshold voltage and ends before a mirror period, during which Vge becomes constant at the value of about the threshold voltage, starts. If Vge approaches the threshold voltage, a channel almost begins to open, and injection of electrons into the drift region begins.

In the example of FIG. 22, electrons that move downward from the channel might flow temporarily in the array direction in an accumulation region 16 (the X-axis direction, or the direction from a region near the gate trench portion 40 toward the middle of the mesa portion 60). However, because in the drift region 18 below the accumulation region 16, an electron accumulation layer is already formed in a region near the gate trench portion 40 (threshold voltage at which an electron accumulation layer is formed in an N-type region is much lower than threshold voltage at which an inversion layer is formed in a P-type region), the impedance in a region near the gate trench portion 40 is lower than that in the drift region 18. Because of this, electron current mainly flows through a region near the gate trench portion 40.

Once electrons reach the collector region 22 on the rear surface, injection of holes starts in a region ranging from the collector region 22 to the buffer region 20 and the drift region 18. Thereby, holes are accumulated in a region near the lower end of a trench portion. As one example, holes are present in a region ranging from a region near the lower end of the gate trench portion 40 to a side portion of a dummy trench portion 30 below an accumulation region 16 on the order of $1 \times 10^{16}$ (cm$^{-3}$).

Holes gather at the lower end of the gate trench portion 40 and the lower end of the dummy trench portion 30. In particular, because a dummy conductive portion 34 is at the same potential as the emitter electrode 52, a hole inversion layer is easily formed at the side wall of the dummy trench portion 30. Holes injected from the collector region 22 gather in a region near this hole inversion layer. Holes are distributed continuously from the dummy trench portion 30 to the lower end of the gate trench portion 40. Due to this hole distribution, large displacement current flows to a region near the lower end of the gate trench portion 40 at the time of turn-on, in some cases.

Displacement current caused by accumulation of holes generates charging of the gate conductive portion 44 facing it, with a gate insulating film 42 being sandwiched therebetween. This charging of the gate conductive portion 44 causes an instantaneous increase in gate voltage Vge. The larger the displacement current is, the more the gate conductive portion 44 is charged, so the potential of the gate conductive portion 44 rises more quickly. As a result, the potential of the gate conductive portion 44 exceeds a gate threshold instantaneously in some cases.

If the potential of the gate conductive portion 44 exceeds the gate threshold instantaneously, injection of a large amount of electrons and holes starts, and the inter-collector-emitter current increases. Corresponding to the rate of change in current due to the increase in the inter-collector-emitter current, the voltage reduction rate (dV/dt) of the inter-collector-emitter voltage increases. The larger the displacement current is, the higher the value of dV/dt is. In particular, the smaller the amount of accumulated holes flowing to the emitter electrode 52 is, the larger the displacement current is, and this leads to a larger instantaneous increase in the potential of the gate conductive portion 44.

Figure 23:
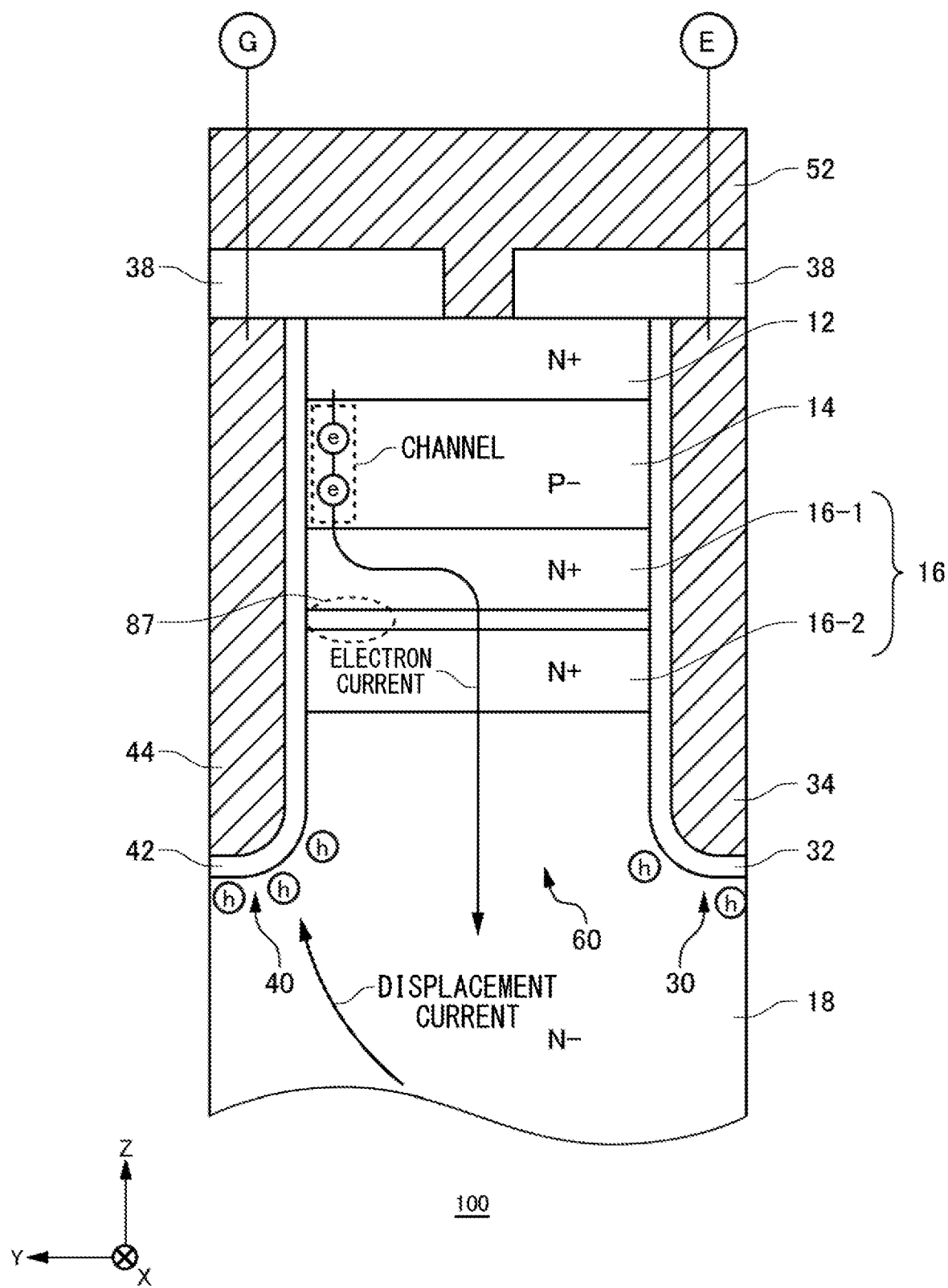
FIG. 23 is a figure showing electron current and displacement current generated at the time of turn-on in the example shown in FIG. 20.

FIG. 23 is a figure showing electron current and displacement current generated at the time of turn-on in the example shown in FIG. 20. In the present example, two accumulation regions 16 are provided. In the present example also, electrons having passed through a channel almost advance in the array direction (X-axis direction) in an accumulation region 16-1. However, in the present example, an accumulation region 16-2 is provided below the accumulation region 16-1. In the present example, the impedance for electron current is lower in the path to directly flow from the accumulation region 16-1 to the accumulation region 16-2 than in the path to return from a region near the middle of the accumulation region 16-1 to a region near the gate trench portion 40, and flow to the accumulation region 16-2.

Among regions below the accumulation region 16-1 and accumulation region 16-2, holes are easily accumulated in a hole high concentration region 87 adjacent to a gate trench portion 40. In addition, due to electron current being flowing not through a region near the gate trench portion 40, but through a region near the middle of a mesa portion 60, accumulation of holes in the hole high concentration region 87 is facilitated. Because of this, a flow of electron current through a region near the middle of the mesa portion 60 is facilitated. Although in FIG. 23, the hole high concentration region 87 in which holes are accumulated is shown schematically, the hole high concentration region 87 may be present only in a region near the boundary between the gate trench portion 40 and the semiconductor substrate 10.

As mentioned above, electron current in the present example advances downward in a region around the middle of the mesa portion 60 sandwiched by the gate trench portion 40 and a dummy trench portion 30, without returning to a region near the gate trench portion 40. That is, the electron current in the present example flows through a region around the middle of the mesa portion 60, not through a region near the gate trench portion 40. The effect of this flow of the electron current through a region around the middle of the mesa portion 60 is created by arraying a plurality of accumulation regions 16 in the depth direction.

If electron current flows through a region around the middle of the mesa portion 60 the hole distribution in a region near a bottom portion of the mesa portion 60 is divided in a region around the middle of the mesa portion 60. Because of this, holes on the dummy trench portion 30 side relative to the path of the electron current do not flow toward the gate trench portion 40 side. This division of the hole distribution at a middle portion of the mesa portion 60 suppresses accumulation of holes at the lower end of the gate trench portion 40. As a result, displacement current can be reduced in the example of FIG. 23 more than in the example of FIG. 22. In the example of FIG. 23, because displacement current can be reduced, charging of the gate conductive portion 44 is reduced, and an instantaneous increase in gate voltage Vge can be suppressed. Thereby, the voltage reduction rate (dV/dt) of the inter-collector-emitter voltage can be suppressed.

The present inventors confirmed by simulation that holes are mainly distributed at the lower end of the gate trench portion 40 and the lower end and a side portion of the dummy trench portion 30, and distributed little at a middle portion of the mesa portion 60. In the present example, holes were present in a region near the lower end of the gate trench portion 40 and in a region near the lower end of the dummy trench portion 30 on the order of $1\times10^{13}$ ($cm^{-3}$). In the example of FIG. 22, holes were present in a region near the lower end of the gate trench portion 40 and in a region near the lower end of the dummy trench portion 30 on the order of $1\times10^{16}$ ($cm^{-3}$).

Reasons for this are not limited to the following reason, but assumingly this is attributable to the fact that in the hole distribution in the example of FIG. 23, the hole distribution between the gate trench portion 40 and the dummy trench portion 30 was divided by electron current. In addition, due to the hole distribution, at the time of turn-on, displacement current smaller than that in the example of FIG. 22 flows from a region near the lower end of the dummy trench portion 30 to a region near the lower end of the gate trench portion 40.

Because of this, in the example of FIG. 23, because displacement current is small as compared with the example of FIG. 22, dV/dt becomes small as compared with that in the example of FIG. 22, and also electromagnetic noises can be reduced. In addition, in the present example, an additional gate resistance Rg provided for the purpose of suppressing a quick increase in the potential of the gate conductive portion 44 may not be connected to the gate conductive portion 44. Alternatively, if a small gate resistance Rg is connected to the gate conductive portion 44, a rapid increase in the potential of the gate conductive portion 44 can be suppressed. Because of this, in the example of FIG. 23, turn-on loss can be reduced as compared with the example of FIG. 22.

Figure 24:
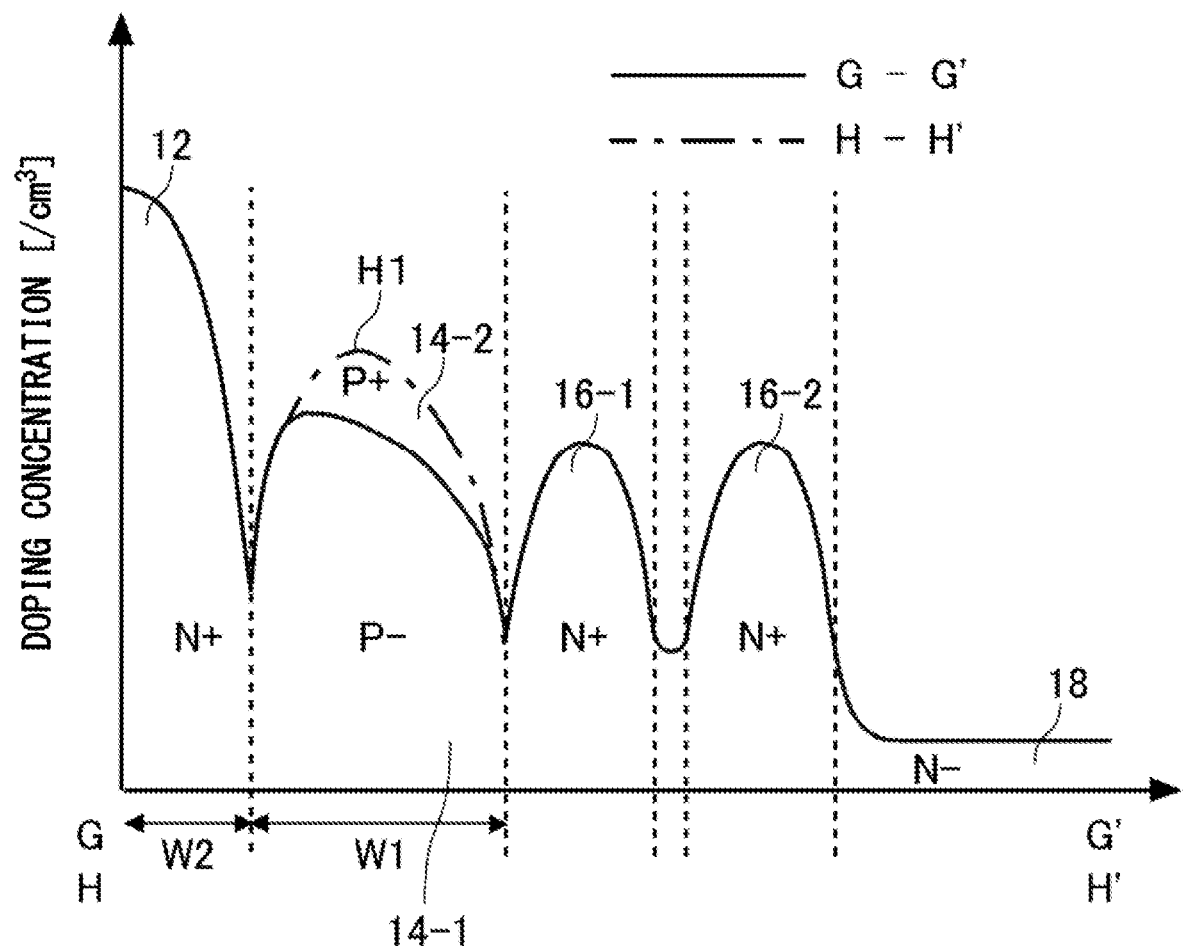
FIG. 24 is a figure showing one example of doping concentration distributions in a cross section taken along G-G' and a cross section taken along H-H' in FIG. 20.

FIG. 24 is a figure showing one example of doping concentration distributions in a cross section taken along G-G' and a cross section taken along H-H' in FIG. 20. In the cross section taken along G-G', a low concentration base region 14-1 is provided between an emitter region 12 and an accumulation region 16 in the Z-axis direction. The doping concentration distribution of the low concentration base region 14-1 may include a peak at which the doping concentration shows its maximum. In the cross section taken along H-H', a high concentration base region 14-2 is provided between the emitter region 12 and the accumulation region 16 in the Z-axis direction.

In the present example, two accumulation regions 16 are provided in the Z-axis direction. The doping concentration distribution of the accumulation region 16 may include a peak at which the doping concentration shows its maximum. The peak•doping concentration of an accumulation region 16-1 may be equal to the peak•doping concentration of an accumulation region 16-2. The peak•doping concentration of the accumulation region 16-2 may be higher than the peak•doping concentration of the accumulation region 16-1. By making the doping concentration of the accumulation region 16-2 higher than the peak•doping concentration of the accumulation region 16-1, the accumulation effect attained by the IE effect can further be enhanced. Because of this, turn-on loss can further be reduced.

In the present example, the doping concentration distribution of the high concentration base region 14-2 in the cross section taken along H-H' has a peak (H1) higher than the concentration distribution of the low concentration base region 14-1 in the cross section taken along G-G'. The concentration at the peak H1 of the doping concentration of the high concentration base region 14-2 in the cross section taken along H-H' may be higher than the peak concentration of the accumulation region 16.

Figure 25:
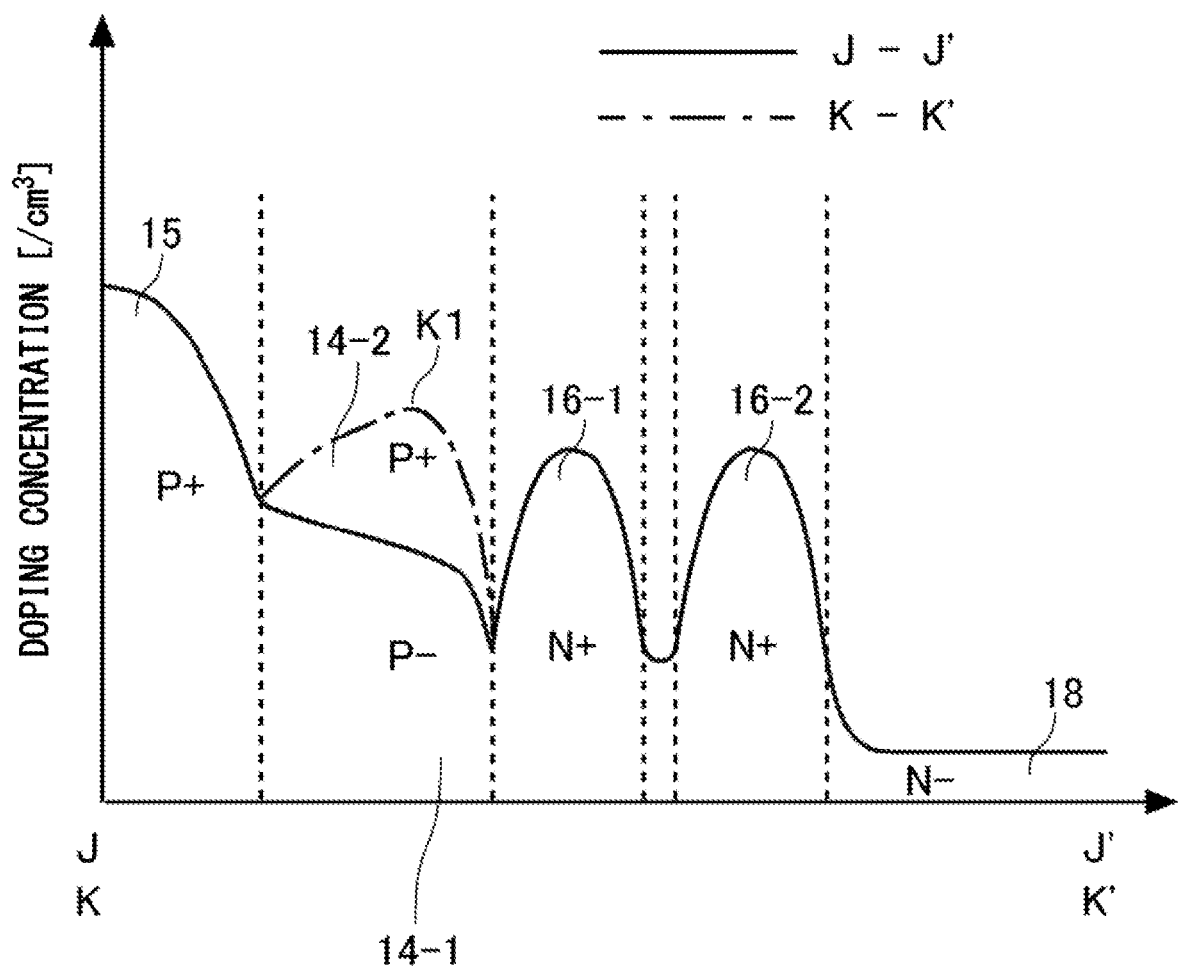
FIG. 25 is a figure showing one example of doping concentration distributions in a cross section taken along J-J' and a cross section taken along K-K' in FIG. 20.

FIG. 25 is a figure showing one example of doping concentration distributions in a cross section taken along J-J' and a cross section taken along K-K' in FIG. 20. In the cross section taken along J-J', a low concentration base region 14-1 is provided between a contact region 15 and an accumulation region 16 in the Z-axis direction. In the cross section taken along K-K', a high concentration base region 14-2 is provided between the contact region 15 and the accumulation region 16 in the Z-axis direction.

In the present example, two accumulation regions 16 are provided in the Z-axis direction. The doping concentration of an accumulation region 16-1 may be equal to the doping concentration of an accumulation region 16-2. The doping concentration of the accumulation region 16-2 may be higher than the doping concentration of the accumulation region 16-1.

In the present example, the doping concentration distribution of the high concentration base region 14-2 in the cross section taken along K-K' has a peak (K1) higher than the doping concentration distribution of the low concentration base region 14-1 in the cross section taken along J-J'.

The peak (K1) in the doping concentration distribution in the cross section taken along K-K' is lower than the doping concentration distribution in the contact region 15. The concentration at the peak D1 of the doping concentration of the high concentration base region 14-2 in the cross section taken along K-K' may be higher than the peak concentration of the accumulation region 16. The peak position of the peak H1 and the peak position of the peak K1 may be the same.

Figure 26:
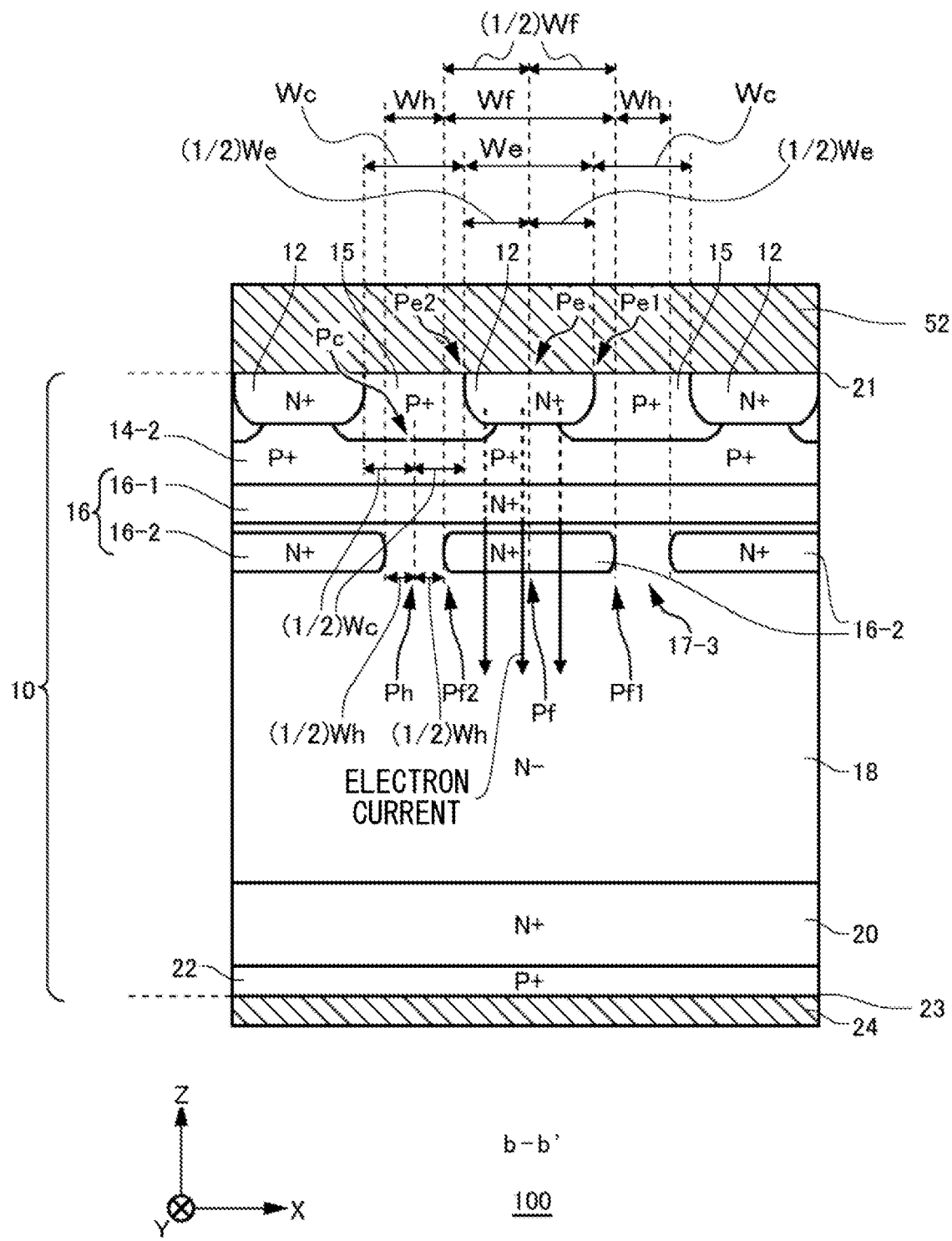
FIG. 26 is a figure showing another example of the cross section taken along b-b' in FIG. 1.

FIG. 26 is a figure showing another example of the cross section taken along b-b' in FIG. 1. The cross section taken along b-b' is an XZ plane through a contact hole 54 in the transistor portion 70. The semiconductor apparatus 100 in the present example is different from the semiconductor apparatus 100 shown in FIG. 21 in that in the semiconductor apparatus 100 shown in FIG. 21, accumulation regions 16-2 are provided below emitter regions 12, and accumulation regions 16-2 are not provided to parts of regions below contact regions 15. In the present example, an accumulation region 16-1 may be provided below the emitter regions 12 and the contact regions 15.

The width of an accumulation region 16-2 in the X-axis direction is defined as a width Wf. The width Wf may be larger than the width We. The width Wf may be no smaller than 120% of the width We and no larger than 180% of the width We.

An end of an emitter region 12 on the X-axis positive side is defined as an end portion Pe1. An end of the emitter region 12 on the X-axis negative side is defined as an end portion Pe2. The end portion Pf1 is a position of an image that imaginarily appears at the upper surface 21 if the end of an accumulation region 16-2 on the X-axis positive side is imaginarily projected onto the upper surface 21. The end portion Pf2 is a position of an image that imaginarily appears at the upper surface 21 if the end of the accumulation region 16-2 on the X-axis negative side is imaginarily projected onto the upper surface 21. The end portion Pf1 may be located in a contact region 15. That is, the end portion Pf1 may be arranged on the positive side relative to the end portion Pe1 in the X-axis direction. The end portion Pf2 may be arranged on the negative side relative to the end portion Pe2 in the X-axis direction. The accumulation region 16-2 may be provided to include the emitter region 12 in the X-axis direction when seen from above.

The middle point of the emitter region 12 in the X-axis direction is defined as a position Pe. The position of an image that imaginarily appears at the upper surface 21 if the middle point of the accumulation region 16-2 in the X-axis direction is imaginarily projected onto the upper surface 21 is defined as a position Pf. In the X-axis direction, the position Pf may coincide with the position Pe. In the X-axis direction, the position Pf may be different from the position Pe.

In the present example, a third opening 17-3 is provided between two accumulation regions 16-2 that are adjacent to each other in the X-axis direction. In the X-axis direction, the width of the third opening 17-3 is defined as a width Wh. The width Wh is the width between the position Pf1 of an accumulation region 16-2 and the position Pf2 of an accumulation region 16-2 that is adjacent to the position Pf1 with the third opening 17-3 being sandwiched therebetween. The width Wh may be smaller than the width We. The width Wh may be no smaller than 20% of the width We and no larger than 80% of the width We.

The middle point of a contact region 15 in the X-axis direction is defined as a position Pc. The middle point of the third opening 17-3 in the X-axis direction is defined as a position Ph. In the X-axis direction, the position Ph may coincide with the position Pc. In the X-axis direction, the position Ph may be different from the position Pc.

The third opening 17-3 may be provided to be included in the contact region 15 in the X-axis direction when seen from above. The third opening 17-3 may be provided at least a part of a region below the contact region 15 in the X-axis direction.

Because in the semiconductor apparatus 100 in the present example, two accumulation regions 16 are provided below an emitter region 12, displacement current can be made small similar to the semiconductor apparatus 100 shown in FIG. 21. As shown in present example, in order to make displacement current small, it is only needed to arrange a plurality of accumulation regions 16 below an emitter region 12. In addition, because in the semiconductor apparatus 100 in the present example, an accumulation region 16-2 is not provided at a part of a region below a contact region 15, the carrier (holes in the present example) can be suitably extracted.

Figure 27:
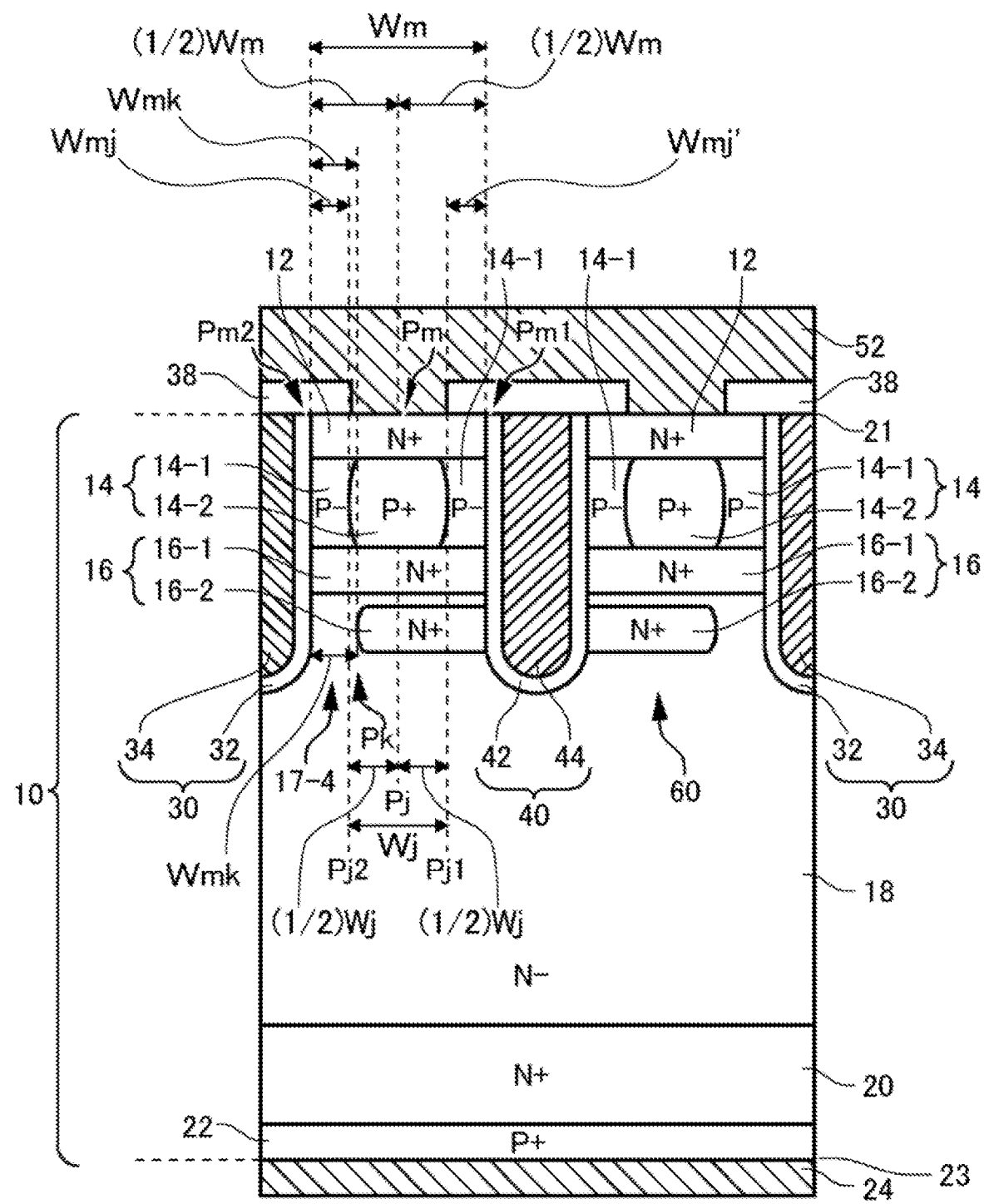
FIG. 27 is a figure showing one example of a cross section taken along f-f in FIG. 1.

FIG. 27 is a figure showing one example of a cross section taken along f-f in FIG. 1. The cross section taken along f-f is a YZ plane passing through emitter regions 12 in the transistor portion 70. In the semiconductor apparatus 100 in the present example, two accumulation regions 16 are provided. An accumulation region 16-1 and an accumulation region 16-2 are arranged side-by-side in the Z-axis direction. In the Z-axis direction, the drift region 18 may be provided between the accumulation region 16-1 and the accumulation region 16-2. Three or more accumulation regions 16 may be provided. All the accumulation regions 16 may be arranged above the lower ends of a gate trench portion 40 and a dummy trench portion 30.

In the present example, the accumulation region 16-2 is provided in contact with the gate trench portion 40, and is provided apart from a dummy trench portion 30. In addition, in the present example, the accumulation region 16-1 is provided in contact with the gate trench portion 40 and dummy trench portion 30.

An N-type region may be located between the accumulation region 16-2 and the dummy trench portion 30. The region may be provided with the drift region 18. Alternatively, the doping concentration between the accumulation region 16-2 and the dummy trench portion 30 may be higher than the doping concentration of the drift region 18 and may be lower than the peak•doping concentration of the accumulation region 16-2. Between the accumulation region 16-2 and the dummy trench portion 30, the doping concentration of the accumulation region 16-2 may show a distribution in which it decreases gradually as the distance from the dummy trench portions 30 decreases.

A mesa width of a mesa portion 60 is defined as a width Wm. An end of the mesa portion 60 on the Y-axis negative side is defined as an end portion Pm1. An end of the mesa portion 60 on the Y-axis positive side is defined as an end portion Pm2. The middle point of the mesa portion 60 in the Y-axis direction is defined as a position Pm.

The width of a high concentration base region 14-2 in the Y-axis direction is defined as a width Wj. An end of the high concentration base region 14-2 on the Y-axis negative side is defined as an end portion Pj1. An end of the high concentration base region 14-2 on the Y-axis positive side is defined as an end portion Pj2. The middle point of the high concentration base region 14-2 in the Y-axis direction is defined as a position Pj. In addition, in the Y-axis direction, an end of the accumulation region 16-2 facing the dummy trench portion 30 is defined as an end portion Pk.

The end portion Pk may be arranged between the end portion Pj2 and the position Pm in the Y-axis direction. Because the end portion Pk is arranged between the end portion Pj2 and the position Pm in the Y-axis direction, electron current can easily flow through a region around the middle of the mesa portion 60.

In the Y-axis direction, the position Pm may coincide with the position Pj. In the Y-axis direction, the position Pm may be different from the position Pj.

The width between the end portion Pm2 and the end portion Pj2 in the Y-axis direction is defined as a width Wmj. The width between the end portion Pm1 and the end portion Pj1 in the Y-axis direction is defined as a width Wmj'. The width Wmj and the width Wmj' may be equal to or different from each other.

In the present example, a fourth opening 17-4 is provided between the dummy trench portion 30 and the accumulation region 16-2 in the Y-axis direction. In the Y-axis direction, the width of the fourth opening 17-4 in the Y-axis direction, that is, the width between the end portion Pm2 and the end portion Pk in the Y-axis direction is defined as a width Wmk. The width Wmk may be larger than or smaller than the width Wmj. The width Wmk may be equal to the width Wmj. The width Wmk may be any width as long as it is not zero and is smaller than ½ of the width Wm.

Because in the semiconductor apparatus 100 in the present example, the accumulation region 16-2 is provided in contact with the gate trench portion 40, displacement current can be reduced similar to the example shown in FIG. 21. Because of this, charging of the gate conductive portion 44 is reduced, and an instantaneous increase in the gate metal layer Vge is suppressed as well. Thereby, the voltage reduction rate (dV/dt) of the inter-collector-emitter voltage can be suppressed.

While the embodiments of the present invention have been described, the technical scope of the invention is not limited to the above described embodiments. It is apparent to persons skilled in the art that various alterations and improvements can be added to the above-described embodiments. It is also apparent from the scope of the claims that the embodiments added with such alterations or improvements can be included in the technical scope of the invention.

The operations, procedures, steps, and stages of each process performed by an apparatus, system, program, and method shown in the claims, embodiments, or diagrams can be performed in any order as long as the order is not indicated by "prior to," "before," or the like and as long as the output from a previous process is not used in a later process. Even if the process flow is described using phrases such as "first" or "next" in the claims, embodiments, or diagrams, it does not necessarily mean that the process must be performed in this order.

EXPLANATION OF REFERENCE SYMBOLS

10: semiconductor substrate; 11: well region; 12: emitter region; 14: base region; 14-1: low concentration base region; 14-2: high concentration base region; 14-3: intermediate region; 15: contact region; 16: accumulation region; 16-1: accumulation region; 16-2: accumulation region; 17-1: first opening; 17-2: second opening; 17-3: third opening; 17-4: fourth opening; 18: drift region; 20: buffer region; 21: upper surface; 22: collector region; 23: lower surface; 24: collector electrode; 25: connecting portion; 29: extending portion; 30: dummy trench portion; 31: connecting portion; 32: dummy insulating film; 34: dummy conductive portion; 38: inter-layer dielectric film; 39: extending portion; 40: gate trench portion; 41: connecting portion; 42: gate insulating film; 44: gate conductive portion; 48: gate runner; 49: contact hole; 50: gate metal layer; 52: emitter electrode; 54: contact hole; 56: contact hole; 60: mesa portion; 61: boundary mesa portion; 70: transistor portion; 80: diode portion; 82: cathode region; 87: hole high concentration region; 100: semiconductor apparatus; 150: semiconductor apparatus; 200: semiconductor apparatus

What is claimed is:

1. A semiconductor apparatus comprising: a semiconductor substrate having a first conductivity-type drift region; a first conductivity-type emitter region that is provided inside the semiconductor substrate and above the drift region and has a doping concentration higher than that of the drift region; a second conductivity-type base region provided inside the semiconductor substrate and between the emitter region and the drift region; a first conductivity-type accumulation region that is provided inside the semiconductor substrate and between the base region and the drift region and has a doping concentration higher than that of the drift region; and a gate trench portion that: is provided to penetrate the emitter region, the base region and the accumulation region from an upper surface of the semiconductor substrate; is arranged to extend in a predetermined direction of extension at the upper surface; and is provided with a conductive portion therein, wherein the base region has: a low concentration base region provided in contact with the gate trench portion; and a high concentration base region that: is provided in contact with the low concentration base region; is provided apart from the gate trench portion; and has a doping concentration higher than that of the low concentration base region, the high concentration base region is provided completely below the emitter region, and a width of the high concentration base region in a depth direction of the semiconductor substrate is larger than 0.1 μm.

2. The semiconductor apparatus according to claim 1, wherein the width of the high concentration base region in the depth direction is no smaller than ⅕ of a width of the emitter region in the depth direction.

3. The semiconductor apparatus according to claim 1, further comprising a second conductivity-type contact region that is provided in contact with the emitter region in the direction of extension and has a doping concentration higher than that of the high concentration base region, wherein the contact region is provided in contact with the high concentration base region.

4. The semiconductor apparatus according to claim 3, wherein a part of the low concentration base region is provided: in contact with the high concentration base region in the direction of extension; and below the contact region.

5. The semiconductor apparatus according to claim 3, wherein a width of the emitter region in the direction of extension is larger than a width of the contact region in the direction of extension.

6. The semiconductor apparatus according to claim 3, wherein the accumulation region has a second opening, and the drift region is in contact with the low concentration base region below the contact region through the second opening.

7. A semiconductor apparatus manufacturing method of manufacturing the semiconductor apparatus according to claim 3, the method comprising:
   doping a first conductivity-type dopant into the contact region; and
   after the doping the first conductivity-type dopant, doping a second conductivity-type dopant into the high concentration base region.

8. The semiconductor apparatus according to claim 1, wherein the high concentration base region protrudes in the depth direction more than the low concentration base region does.

9. The semiconductor apparatus according to claim 1, wherein the emitter region is provided in contact with the high concentration base region.

10. The semiconductor apparatus according to claim 1, wherein the high concentration base region is provided in contact with the accumulation region.

11. The semiconductor apparatus according to claim 1, wherein a width, in the direction of extension, of the high concentration base region in contact with the accumulation region is larger than a width, in the direction of extension, of the low concentration base region in contact with the accumulation region.

12. The semiconductor apparatus according to claim 1, wherein in the depth direction, the low concentration base region is provided between the accumulation region and the high concentration base region.

13. The semiconductor apparatus according to claim 1, wherein
   the accumulation region has a first opening, and
   the drift region is in contact with the high concentration base region below the emitter region through the first opening.

14. The semiconductor apparatus according to claim 13, wherein
   the first opening is provided apart from the gate trench portion, and
   the drift region is in contact with the high concentration base region below the emitter region through the first opening.

15. The semiconductor apparatus according to claim 1, further comprising a dummy trench portion that is provided to spread from the upper surface into the semiconductor substrate, and is arranged to extend in the direction of extension, wherein
   the accumulation region, the high concentration base region and the emitter region are provided in contact with the dummy trench portion.

16. The semiconductor apparatus according to claim 1, further comprising:
   a dummy trench portion that is provided to spread from the upper surface into the semiconductor substrate and is arranged to extend in the direction of extension; and
   a second conductivity-type intermediate region that is provided between the drift region and the high concentration base region in the depth direction and has a doping concentration lower than that of the high concentration base region, wherein
   the intermediate region, the high concentration base region and the emitter region are provided in contact with the dummy trench portion.

17. The semiconductor apparatus according to claim 1, comprising a plurality of the accumulation regions in the depth direction of the semiconductor substrate.

18. The semiconductor apparatus according to claim 17, wherein the plurality of accumulation regions are in contact with the gate trench portion.

19. The semiconductor apparatus according to claim 17, wherein the plurality of accumulation regions are provided below the emitter region.

* * * * *